(12) United States Patent
Hachisuka et al.

(10) Patent No.: US 7,598,748 B2
(45) Date of Patent: Oct. 6, 2009

(54) INVERTER SYSTEM

(75) Inventors: Seiji Hachisuka, Kawasaki (JP);
Masaru Tanaka, Kawasaki (JP);
Minoru Senba, Kawasaki (JP);
Shuuichi Yadoori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 424 days.

(21) Appl. No.: 10/620,597

(22) Filed: Jul. 17, 2003

(65) Prior Publication Data

US 2004/0012381 A1 Jan. 22, 2004

(30) Foreign Application Priority Data

Jul. 22, 2002 (JP) .............................. 2002-212666
Jun. 26, 2003 (JP) .............................. 2003-183034

(51) Int. Cl.
*G01R 19/20* (2006.01)
*G01R 29/08* (2006.01)
(52) U.S. Cl. ..................... 324/522; 324/529; 324/750
(58) Field of Classification Search ............... 324/522, 324/127, 750, 529
See application file for complete search history.

(56) References Cited

U.S. PATENT DOCUMENTS

| 4,985,819 | A | | 1/1991 | Mori et al. |
| 5,130,638 | A | * | 7/1992 | Furukawa .................... 324/67 |
| 5,268,832 | A | | 12/1993 | Kandatsu |
| 5,563,777 | A | * | 10/1996 | Miki et al. ................... 363/37 |
| 5,583,402 | A | * | 12/1996 | Moisin et al. ................ 315/307 |
| 5,619,105 | A | * | 4/1997 | Holmquest .................. 315/225 |
| 5,652,521 | A | * | 7/1997 | Meyer ......................... 324/551 |
| 5,789,926 | A | | 8/1998 | Badenlou |
| 5,892,646 | A | * | 4/1999 | Parker et al. ................. 361/42 |

(Continued)

FOREIGN PATENT DOCUMENTS

CN 1351408 5/2002

(Continued)

OTHER PUBLICATIONS

Notification of Reasons for Refusal from Japanese Patent Office dated Nov. 30, 2004.

(Continued)

*Primary Examiner*—Vincent Q Nguyen
*Assistant Examiner*—John Zhu
(74) *Attorney, Agent, or Firm*—Staas & Halsey LLP

(57) ABSTRACT

An inverter system which converts DC input into AC output and supplies the AC output to a load such as an FL tube detects change in a circuit current due to anomaly such as discharge without contacting with a current route. Relating to an inverter which converts DC input into AC output and supplies the AC output to a load, change in a circuit current of the inverter is detected through the medium of magnetic flux change due to the change in the circuit current caused by discharge. For example, if change in a current occurs in the circuit current of the inverter by disconnection discharge or ground-fault discharge occurring in a current route including a load of the inverter, magnetic flux change occurs in circuit wiring and a space of a core gap of a transformer of the inverter. The change in the circuit current is detected through the medium of the magnetic flux change without contacting with the circuit wiring or the transformer.

8 Claims, 14 Drawing Sheets

U.S. PATENT DOCUMENTS

| | | | |
|---|---|---|---|
| 5,903,159 A * | 5/1999 | Miyata et al. | 324/536 |
| 5,952,791 A | 9/1999 | Suzuki et al. | |
| 5,952,832 A | 9/1999 | Stevanovic et al. | |
| 6,111,732 A * | 8/2000 | Beland | 361/42 |
| 6,252,409 B1 * | 6/2001 | Iijima | 324/529 |
| 6,414,475 B1 * | 7/2002 | Dames et al. | 324/127 |
| 6,614,211 B1 * | 9/2003 | Douglas | 324/67 |
| 6,731,105 B1 * | 5/2004 | Hoyle et al. | 324/117 R |
| 6,781,359 B2 * | 8/2004 | Stauth et al. | 324/117 H |
| 7,098,677 B2 * | 8/2006 | Kazama et al. | 324/750 |
| 2001/0019492 A1 | 9/2001 | Burton | |
| 2002/0158591 A1 | 10/2002 | Ribarich et al. | |
| 2004/0012987 A1 | 1/2004 | Hachisuka et al. | |
| 2005/0073295 A1 | 4/2005 | Hastings et al. | |

FOREIGN PATENT DOCUMENTS

| | | |
|---|---|---|
| JP | 54-82624 | 7/1979 |
| JP | 03183965 A * | 8/1991 |
| JP | 03-207274 | 9/1991 |
| JP | 09-182449 | 7/1997 |
| JP | 11/122819 | 4/1999 |
| JP | 11-252937 | 9/1999 |
| JP | 11-354285 | 12/1999 |
| JP | 2002-341775 | 11/2002 |

OTHER PUBLICATIONS

Office Action for corresponding Chinese Application No. 03150194X dated Jun. 17, 2005.

U.S. Appl. No. 10/368,598, filed Feb. 20, 2003, Seiji Hachisuka, et al., Fujitsu Limited.

Patent Abstracts of Japan vol. 1999, No. 9, Jul. 30, 1999 & JP 11 121190 (Hitachi Ltd), Apr. 30, 1999.

Patent Asbtracts of Japan vol. 18, No. 442 (E-1593), Aug. 17, 1994 & JP 06 140173 (Nippondenso Co Ltd) May 20, 1994.

Ondo K et al: "Thin type DC/DC converter using a coreless wire transformer" Power Electronics Specialists Conference, PESC '94 Record., $25^{th}$ Annual IEEE Taipei, Taiwan Jun. 20-25, 1994, New York, NY USA, IEEE, Jun. 20, 1994, pp. 1330-1334, XP010121291.

Turner G R et al: "Rogowski coils for short duration (>10 / spl mu/S) pulsed current (<10 kA) measurements" Africon, 1999 IEEE Cape Town, South Africa Sep. 28-Oct. 1, 1999, Piscataway, NJ, USA, IEEE, US, Sep. 28, 1999, pp. 759-764, XP010367259.

United States Patent Office Action, mailed Aug. 15, 2007 and issued in related U.S. Appl. No. 11/616,631.

United States Patent Office Action, mailed Jul. 19, 2007 and issued in related U.S. Appl. No. 11/616,623.

United States Patent Office Action, mailed Jan. 3, 2008 and issued in related U.S. Appl. No. 11/616,623.

United States Patent Office Action, mailed Mar. 18, 2008 and issued in related U.S. Appl. No. 11/616,631.

United States Patent Office Action, mailed Jun. 3, 2008 and issued in related U.S. Appl. No. 11/616,623.

* cited by examiner

F I G. 11A
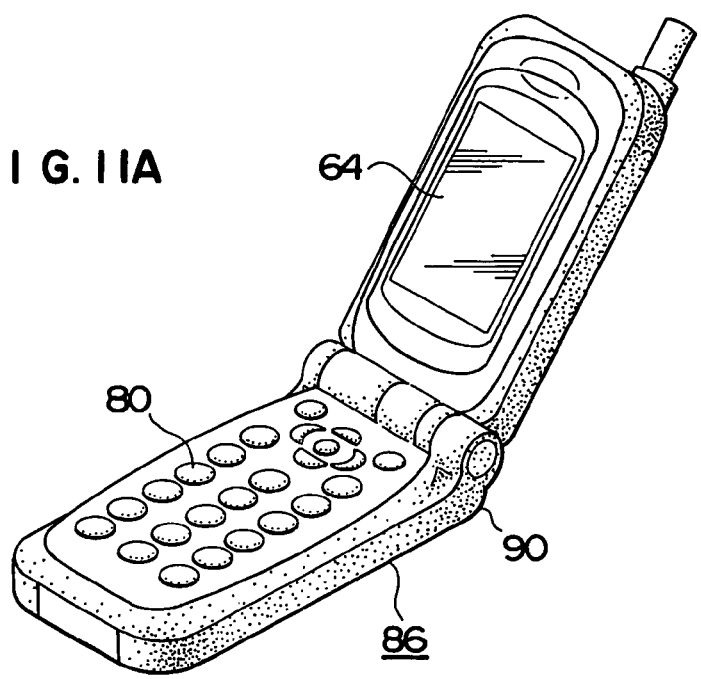
F I G. 11B
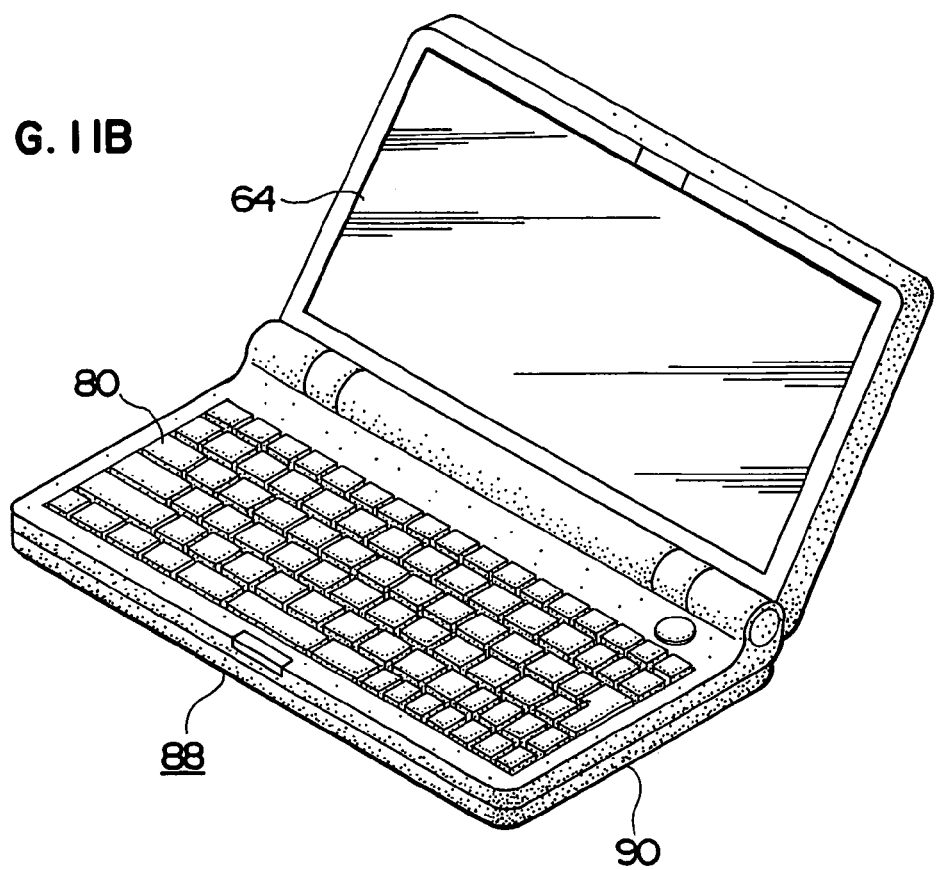

INVERTER SYSTEM

BACKGROUND OF THE INVENTION

1. Field of the Invention

The present invention relates to an inverter system for feeding AC output to various loads such as a fluorescent light tube for use as the backlight of a liquid crystal display. In particular, the present invention relates to a current detection method of an inverter for detecting change in a circuit current caused by disconnection discharge of circuit wiring of the inverter, proximity discharge between high voltage and low voltage parts of the circuit wiring, and so on, through the medium of magnetic flux change. Further, the present invention relates to a current detection circuit thereof, an anomaly detection method thereof, an anomaly detection circuit thereof, a display device, an electronic device such as a display device and an information processing device, a test method, and a test device.

2. Description of the Related Art

For a liquid crystal display (LCD), a fluorescent light tube (FL tube) is used as a light source for backlight use, and an inverter is used as a lighting device. The inverter adopts a constant current circuit for adjustment of luminance, and so on, and the FL tube is driven by a constant current to be lit up with a low current of about several mA at a high voltage, for example, in the order of 1.5 kV. A current route including the FL tube to which AC output from the inverter is supplied corresponds to a segment of wiring, leading from a winding of an inverter transformer, on the high voltage side thereof, to the FL tube, and is susceptible to deformation under external pressure because it is long and thin in size since it passes by way of a multitude of members such as windings of the inverter transformer, a conductor pattern on a printed circuit board, connectors, wiring, etc. With a cellular phone and a note type personal computer, an installation space for the FL tube lighting device is particularly narrow, so that thin wiring leading from the inverter to the FL tube is susceptible to deformation due to external pressure.

In case that disconnection occurs to the above-described current route of the inverter, flow of current is cut off by the disconnection, however, there arises a risk of the current route being maintained because the constant current at the high voltage flows in the current route of the FL tube, and a rise in voltage occurs at the time of the disconnection, thereby resulting in continuation of discharge at a spot of the disconnection. When the current route is maintained, current flows in the tube, so that the FL tube remains lit up. Since it is impossible to know behavioral anomaly from a lighting state, discovery of that behavioral anomaly is delayed. Continuation of such an anomalous state is not preferable.

Therefore, concerning an inverter for feeding AC output to various loads such as a fluorescent light tube for use as the backlight of a liquid crystal display, technical development which relates to a device for avoiding the continuation of anomaly and displaying such anomaly by detecting anomaly of disconnection discharge of circuit wiring, dielectric breakdown discharge between high voltage and low voltage parts and ground-fault discharge is desired.

Concerning a technology relating to detection of behavioral anomaly of an inverter and avoidance of continuation of the behavioral anomaly, as earlier patent documents, the Japanese Patent Laid Open Publications No. 6-140173, No. 11-121190, No. 9-113546 and so on are in existence.

According to the Publication No. 6-140173, as a protecting device for a discharge lamp lighting system, even if an discharge lamp is lit out at the time of anomaly, inconvenience to maintain the operation of a transistor inverter is avoided wherein an output of the inverter is taken out to monitor an oscillation condition by a monitor circuit, and anomaly occurring at the oscillation condition due to a short circuit inside the discharge lamp and so forth is detected by a monitoring pulse voltage so as to stop the operation of the inverter by stopping the feed of a DC voltage, and light out the discharge lamp. However, such a protection device is complex in configuration because it requires the monitor circuit for taking out the output of the inverter and monitoring thereof, a microcomputer for determining whether the monitoring pulse voltage is normal or anomalous, and so forth, and also since the output of the inverter is taken out to an outside, the inverter side is forced to take measures to cope with the change in an operating condition.

Further, according to the Publication No. 11-121190, as a discharge lamp lighting device, noting that a high frequency voltage value is lowered when the high frequency voltage to be fed to an discharge lamp is discharged between a ground and a low voltage part, the high frequency voltage is detected by a high frequency voltage detection resistor connected to the discharge lamp, and the high frequency voltage is rectified to be converted into a DC voltage, and when a level of the DC voltage is in anomalous level, the discharge lamp lighting device is stopped in operation. However, the discharge lamp lighting device requires the high frequency voltage detection resistor directly connected to the discharge lamp, and also the difference in voltage at the time of normal and that at the time of anomaly (at the time of discharge) is determined by a voltage dividing ratio of a resistance voltage divider circuit configured by the high frequency voltage detection resistor and a threshold level of a switching transistor, and so forth, and hence the accuracy of determination of whether it is normal or anomalous is low, and also there is a risk of stoppage of operation by a level change at the time of normal. Even with the discharge lamp lighting device, since high frequency voltage detection resistor is connected to the high voltage part side to detect a high frequency voltage, special measures for changing a circuit condition and taking out the detection voltage are required.

Furthermore, the Publication No. 9-113546 relates to an overcurrent detecting circuit, and discloses that a current transformer detecting a current fed to a load from a switching power source section is used. The overcurrent detecting circuit controls a switching power source section by an overcurrent detection signal which is caused based on a detection of an overcurrent fed to the load, and makes DC output voltage droop from the switching power source section to the load. This overcurrent detecting device is not a device which detects change in a circuit current due to discharge occurring a current route or a load side.

Meanwhile, if there occurs discharge at a spot of the break of circuit wiring and between high voltage and low voltage parts, an electric change due to that discharge can be checked. When discharge occurs to a disconnection spot, a voltage value or current value representing discharge is increased inside the inverter, but the amount of change is small, and hence even if the detection voltage is simply compared with a reference voltage, when the difference in level therebetween at the time of anomaly and normal is small, an erroneous operation is easy to occur, and hence it is not practical. In order to enhance accuracy of the detection of disconnection discharge or dielectric breakdown discharge between high and low voltage parts, a circuit having the combination of a differentiation circuit, a timer circuit and so forth is required, which however renders the circuit complex, which increases in manufacturing cost by adding a circuit like this to the inverter, resulting in lack of practice. In the case where the amount of change in waveforms is small at the time of normal behavior and at the time of discharge such as a very small discharge, sufficient accuracy of detection cannot be obtained even if a differentiation circuit is used, so that an erroneous operation is easy to occur and it lacks in reliability.

In the case of driving a load such as an FL tube by using a inverter, it is indispensable for maintenance of reliability of operation of an inverter and a load side thereof to discover disconnection discharge or discharge between high voltage and low voltage parts occurring in the current route and to prevent the continuation of an anomalous state. However, these problems are not disclosed in the Publications No. 6-140173, No. 11-121190 and No. 9-113546, and means for solving the problems is not presented either.

Further, an obstacle due to very small discharge of an LCD is a defect due to assembly work of the LCD. Although that defect is detected by a visual confirmation and so on, certainty and reliability of that detection are lower. Many of ground-fault discharge occurring between a high-voltage part and the ground around thereof are due to damage occurring in a covering of a high-voltage wiring, engagement between parts of wiring, a tear of an insulating tube of a soldered part, and so on, and is also due to an impression of stress to semiconductors in the LCD. Because of this, an additional test of dielectric strength is required. Further, disconnection discharge of a high-voltage current route is due to disconnection of a soldered part, contact fault of a connector, disconnection of a wiring, and so on. Although an electric detection method of discharge like this is performed by observation of current waveform, preparation of a testing equipment and time of a test are longer. Further, for an inspection, a visual confirmation of an appearance is also performed. Even a product to which such a test has been performed, a detection of a fuming obstacle occurring after the lapse of time is difficult. Therefore, in the LCD, a test method and a test device which can discover an obstacle such as disconnection discharge and ground-fault discharge with ease and can obtain a test result with high reliability are desired.

SUMMARY OF THE INVENTION

The present invention relates to an inverter for converting DC input into AC output so as to feed the AC output to a load such as an FL tube and so forth, and it is an object of the invention to detect change in a circuit current caused by discharge with ease, without contacting with a current route.

Another object of the present invention relates to an inverter for converting DC input into AC output so as to feed the AC output to a load such as an FL tube and so forth, and is to previously avoid an unforeseen accident by stopping the continuation of power supply at the time of anomaly.

Still another object of the present invention is to provide an electronic device, such as an information processing device, of which reliability of display is improved.

Still another object of the present invention relates to a test method and a test device using an inverter for converting DC input into AC output so as to feed the AC output to a load, and is to provide the test method and the test device which can obtain a test result with high reliability.

In order to attain the above objects, a current detection method of an inverter according to the present invention is a current detection method of an inverter which converts DC input into AC output and supplies the AC output to a load, and has a construction that detects change in a circuit current through the medium of magnetic flux change due to the change in the circuit current of the inverter caused by discharge.

If disconnection discharge occurring in a current route including a load of the inverter or proximity discharge namely ground-fault discharge between high voltage and low voltage parts of a circuit wiring arise, current change occurs in a circuit current of the inverter, and that change makes magnetic flux change occur at a circuit wiring and at a space of a core gap of a transformer. Therefore, if the change in the circuit current is detected through the medium of the magnetic flux change, the change in the circuit current can be detected without contacting with the circuit wiring and the transformer. By this, it is possible to know anomaly such as discharge occurring in the current route from that change.

In order to attain the above objects, a current detection circuit of an inverter according to the present invention is a current detection circuit of an inverter which converts DC input into AC output and supplies the AC output to a load, and has a construction that provides a current detection part (30) for detecting change in a circuit current through the medium of magnetic flux change due to the change in the circuit current of the inverter caused by discharge. That is, with the current detection part, the magnetic flux change is detected, and the change in the circuit current due to that magnetic flux change is taken out without contacting with the circuit wiring. Therefore, it is possible to know anomaly such as disconnection discharge or ground-fault discharge which occurs in the current route.

In order to attain the above objects, in the current detection circuit of the inverter according to the present invention, the current detection part may also be constructed so that a detecting conductor (a current detection line 36) is provided adjacent to a space of a core gap of a transformer (an inverter transformer 22) or a circuit wiring (16, etc.) of the inverter, and so that magnetic flux change occurring in the circuit wiring or the space of the core gap of the transformer is detected by the detecting conductor. According to a construction like this, if current change occurs in the circuit current by disconnection discharge or ground-fault discharge of a current route, magnetic flux change corresponding to the change in the circuit current occurs in the circuit wiring and the space of the core gap of the transformer. If the magnetic flux change acts on the detecting conductor, high voltage is generated. Since this high voltage depends on the change in the circuit current due to the magnetic flux change, the change in the circuit current can be easily detected by the high voltage, and it is possible to know anomaly such as disconnection discharge or ground-fault discharge occurring in the current route. In this case, since the magnetic flux change is detected by a simple construction which only disposes the detecting conductor in proximity to the circuit wiring, an influence of the current detection is not exerted to a circuit of the inverter side, and the change in the circuit current can be detected with high accuracy without an erroneous operation, without contacting with a circuit wiring and so on, and without relating to the operation of the inverter. Further a circuit construction is not complicated without requiring a differentiation circuit and so on, either.

In order to attain the above objects, an anomaly detection method of an inverter according to the present invention is an anomaly detection method of an inverter which converts DC input into AC output and supplies the AC output to a load, and has constitution that detects change in a circuit current through the medium of magnetic flux change due to the change in the circuit current of the inverter caused by discharge, and detects based on that detection result whether or not anomaly exists in a current rote including the load.

According to constitution like this, based on whether or not a level of the change in the circuit current detected through the medium of the magnetic flux change without contacting exceeds a predetermined level, it is possible to know whether or not anomaly exists in the current rote including the load, with ease.

In order to attain the above objects, an anomaly detection circuit of the inverter according to the present invention is an anomaly detection circuit of the inverter (2) which converts DC input into AC output and feeds the AC output to a load (an FL tube 4), and comprises a current detection part (30) and a detection signal output part (a comparator 34). The current detection part is a construction that detects the change in the circuit current through the medium of magnetic flux change due to the change in the circuit current of the inverter caused by discharge, and the detection signal output part is a construction that, according to a result of detection of the current detection part, outputs a detection signal representative of whether or not anomaly exists in the current route including the load.

In a construction like this, if anomaly such as disconnection discharge or ground-fault discharge occurs in the current route between the inverter and the load under a state that high-voltage output is supplied from the inverter (2) to the load such as the FL tube (4), a circuit current of the inverter is changed, and the change in the circuit current causes magnetic flux change ($\Delta\phi$) to occur to the circuit wirings (14, 16, 52, 54, 70, 72). With the inverter for feeding a high voltage output to the load, even if the current route is disconnected, discharge occurs in the disconnection spot and the current route is maintained. In this case, there occurs the change in circuit current due to the continuation of discharge which causes magnetic flux change to occur to the circuit wiring. Further, when ground-fault discharge occurs between the high voltage and low voltage parts at the output side due to dielectric breakdown, the discharge causes the occurrence of an abrupt change in the circuit current, the change in the circuit current causes an abrupt magnetic flux change ($\Delta\phi$) to occur to the circuit wirings. By action of the magnetic flux change, in the current detection part, the change in the circuit current is detected, and high voltage representative of that change is taken out. By this, in the detection signal output part, a detection signal representative of whether or not anomaly such as disconnection discharge or ground-fault discharge in the current route including a load of the FL tube and so on exists is obtained. Therefore, it is possible to indirectly know whether or not anomaly exists in the current route without touching a circuit current and voltage of the inverter side.

In this case, since the change in the circuit current is detected through the medium of the magnetic flux change, the change in the circuit current can be detected without contacting, without relating to a circuit construction of the inverter side, and without adding modification to the circuit conditions of the inverter, and it is possible to monitor whether or not anomaly exists in the current route.

As described above, according to the anomaly detection method and the anomaly detection circuit, behavioral anomaly such as disconnection discharge of the circuit wiring, the dielectric breakdown discharge and so forth can be detected without an erroneous operation with a simple construction without requiring a complex circuit. Since the change in the circuit current caused by discharge and so on can be detected through the medium of the magnetic flux change which occurring to the circuit wiring, behavioral anomaly can be detected with high accuracy from an anomalous waveform generated due to disconnection discharge of the circuit wiring, discharge between the high voltage and low voltage and so forth, and also the detection accuracy is high, and further the occurrence of behavioral anomaly can be immediately detected. Further, since the change in the circuit current can be indirectly detected without touching the circuit wiring, the current change detection part, detection signal output part, and control part can be configured independently of the circuit configuration at the inverter side, without influencing on or changing the circuit configuration of the inverter or load and without requiring a specific part or circuit such as a complex differentiation circuit and so forth.

In order to attain the above objects, in the anomaly detection circuit of the inverter according to the present invention, the inverter may also be constructed so that a control part (an inverter control part 20) stops an inverter operation upon reception of the detection signal at the time of behavioral anomaly. Since the inverter operation is stopped when anomaly such as disconnection discharge or ground-fault discharge occurs in the current route, the inverter and the load can be protected from continuation of behavioral anomaly, and it is possible to improve safety and reliability of the inverter.

In order to attain the above objects, a display device according to the present invention has the current detection circuit of the inverter or the anomaly detection circuit of the inverter, and displays the stop of a inverter operation or anomaly at the time of the anomaly.

The display by the display device includes image display, sound of buzzer, other sound information notice and so forth. The display device receives a detection signal from the detection signal output part and performs the following operations at the time of behavioral anomaly.

(1) Display of behavioral anomaly such as disconnection discharge and ground-fault discharge,
(2) Display of stop of the inverter operation,
(3) Display of either (1) or (2) or both (1) and (2).

It is possible to easily detect behavioral anomaly and the stop of the inverter operation from these displays so that necessary measures can be taken as soon as practicable.

According to a construction like this, behavioral anomaly or the stop of inverter operation is displayed at the time of behavioral anomaly, it is possible to easily detect behavioral anomaly or stop of the inverter operation from the display, thereby improving a protection function, and enhancing a reliability of the inverter operation.

In order to attain the above objects, an electronics device such as an information processing device according to the present invention is a construction that provides the current detection circuit of the inverter, the anomaly detection circuit of the inverter, or the display device. According to an information processing device like this, a lighting device for driving an illumination load such as a discharge tube and so forth and a power supply system such as a power supply circuit and so forth can be constructed using the inverter of the present invention. Further, if the information processing device is constructed using the current detection circuit and/or the anomaly detection circuit of such an inverter, behavioral anomaly such as disconnection discharge and ground-fault discharge can be discovered, or continuation of behavioral anomaly can be avoided, the display of behavioral anomaly or the display of the stop of inverter operation can be displayed, and also confirmation of an operating condition can be performed with ease, thereby facilitating the protection of the display device of the information processing side. Still further, a reliability of a power supply device of various circuits can be enhanced, and the information processing device can be protected from continuation of behavioral anomaly of a power supply system, thereby contributing to a reliability of the operation.

In order to attain the above objects, a test method according to the present invention is a test method using an inverter which converts DC input into AC output and supplies the AC output to a load, and has constitution that detects the change in the circuit current through the medium of magnetic flux change due to the change in the circuit current of the inverter caused by discharge, and decides based on a result of that detection whether or not anomaly exists in the current route including the load.

In order to attain the above objects, a test device according to the present invention has an inverter which converts DC input into AC output and supplies the AC output to a load, and a current detection part which detects the change in the circuit current through the medium of magnetic flux change due to the change in the circuit current of the inverter caused by discharge, and decides based on a result of that detection whether or not anomaly exists in the current route including the load.

According to constitution like this, the change in the circuit current due to disconnection discharge or ground-fault discharge of a current route, and soon, is detected through the medium of magnetic flux change, and anomaly such as disconnection discharge or ground-fault discharge of the current route is detected from a result of that detection with ease and with high accuracy. Further, according to this test, it is possible to decide whether or not anomaly exists without giving an electrical influence to a current route of a load side of which power source is supplied from the inverter.

Therefore, according to the test method and the test device, the power source is supplied to the current route including a load to which the AC output of the inverter is supplied and the test is performed. Because of this, whether or not anomaly such as disconnection discharge or ground-fault discharge occurring in the current route exists is detected with ease, and a test result with high reliability can be obtained. By this, it is possible to improve reliability of various kinds of products such as an FL tube and a liquid crystal display unit.

BRIEF DESCRIPTION OF THE DRAWINGS

The foregoing and other objects, features and attendant advantages of the present invention will be appreciated as the same become better understood by means of the following description and accompanying drawings wherein:

FIG. 11A is a perspective view showing a cellular phone using an inverter, as an embodiment of an information processing device according to the present invention;

FIG. 11B is a perspective view showing a note type personal computer using an inverter, as another embodiment of an information processing device according to the present invention;

DETAILED DESCRIPTION OF THE PREFERRED EMBODIMENTS

Figure 1:
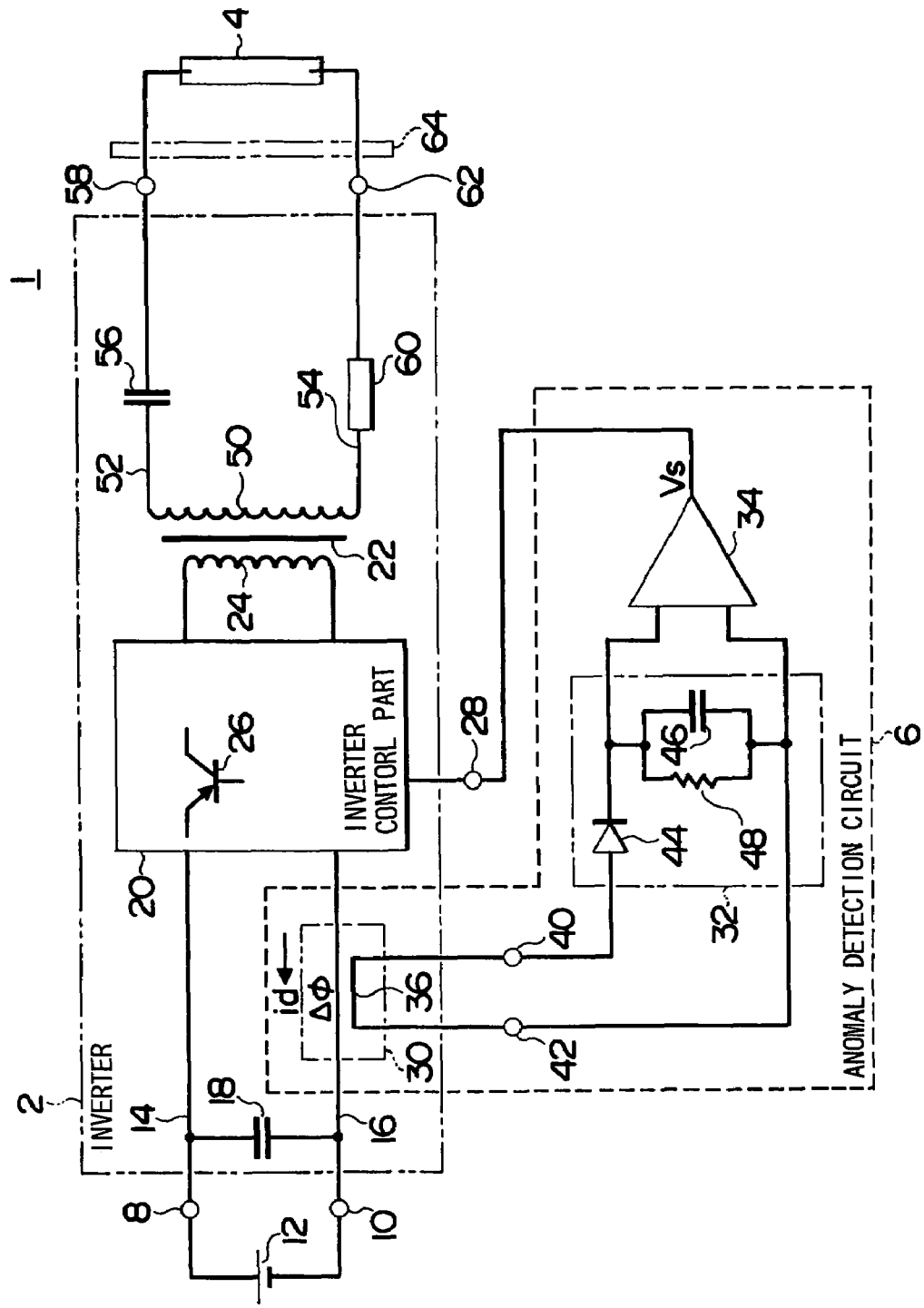
FIG. 1 is a circuit diagram of an FL tube lighting device according to an embodiment of a current detection method of an inverter, a current detection circuit thereof, an anomaly detection method thereof and an anomaly detection circuit thereof of the invention.

An embodiment of a current detection method of an inverter, a current detection circuit thereof, an anomaly detection method thereof and an anomaly detection circuit thereof according to the present invention is explained by referring to FIG. 1. FIG. 1 shows an FL tube lighting device according to an embodiment of the present invention. The FL tube lighting device constitutes an FL tube lighting device used as a backlight of a liquid crystal display (LCD).

The FL tube lighting device 1 is provided with an inverter 2 for converting DC input into AC output, an FL tube 4 serving as a load to which the AC output is fed, and an anomaly detection circuit 6 connected to the inverter 2 for detecting disconnection discharge and dielectric breakdown discharge occurring to a circuit wiring.

The inverter 2 has DC input terminals 8, 10 for receiving DC input and the DC input terminals 8, 10 are connected to a DC power source 12 from which DC input to be converted into AC output is fed. The DC power source 12 includes various DC power sources such as a battery, an AC-DC converter, and so forth. Circuit wirings 14, 16 are connected to the DC input terminals 8, 10 so as to form a current route of a DC input current and an input smoothing capacitor 18 is connected to the circuit wirings 14, 16. The circuit wirings 14, 16 are formed of, for example, a conductor pattern on a printed circuit board, and the input smoothing capacitor 18 constitutes a filter for removing fluctuation component of a voltage ripple and the like included in the DC input and smoothes out a fluctuating DC input so as to stabilize it. The DC input is fed to an inverter control part 20 through the DC input terminals 8, 10 and the circuit wirings 14, 16. The inverter control part 20 comprises, for example, not shown, push-pull inverter circuit part formed of multiple transistors serving as switching elements, a drive circuit part, a switching controller, and so forth, and it also constitutes an oscillation circuit including a primary winding 24 of an inverter transformer 22 and so on in a feedback circuit. In this embodiment, the inverter control part 20 incorporates a switch 26 for switching supply of power to the circuit wiring 14. The switch 26 switches over supply of power from outside on the basis of a control input fed to a latch input terminal 28 serving as a control input part of the inverter control part 20. A known device such as a general-purpose control IC (TI, TL5001, and so forth) which is already available in a market can be used as the inverter control part 20, and hence a detailed circuit configuration is omitted.

In the inverter 2, the anomaly detection circuit 6 for detecting behavioral anomaly comprises a current detection part 30 for detecting a circuit current, a current change detection part 32 for detecting a circuit current change caused by discharge, and a comparator 34 serving as anomaly determining means for determining whether a change level of the detected circuit current is anomalous or not.

The current detection part 30 is a circuit part which detects a change in the circuit current through the medium of a magnetic flux change cased by the change in the circuit current from the circuit wiring 16 of the inverter 2, and so on. In this embodiment, the circuit wiring 16 side of the inverter 2, which is a lower potential side thereof, is set as a current detection point. In the current detection part 30, a current detection line 36 is provided as a detecting conductor which detects the change in the circuit current through the medium of a magnetic flux change $\Delta\phi$ that occurs to the circuit wiring 16. In this case, DC input current id is a detection target in connection with the change in circuit current, to be detected. The current detection line 36 is arranged in the vicinity of the circuit wiring 16, and at such a spacing therefrom as allowing the magnetic flux change $\Delta\phi$ occurring thereto to be detected.

Figure 2:
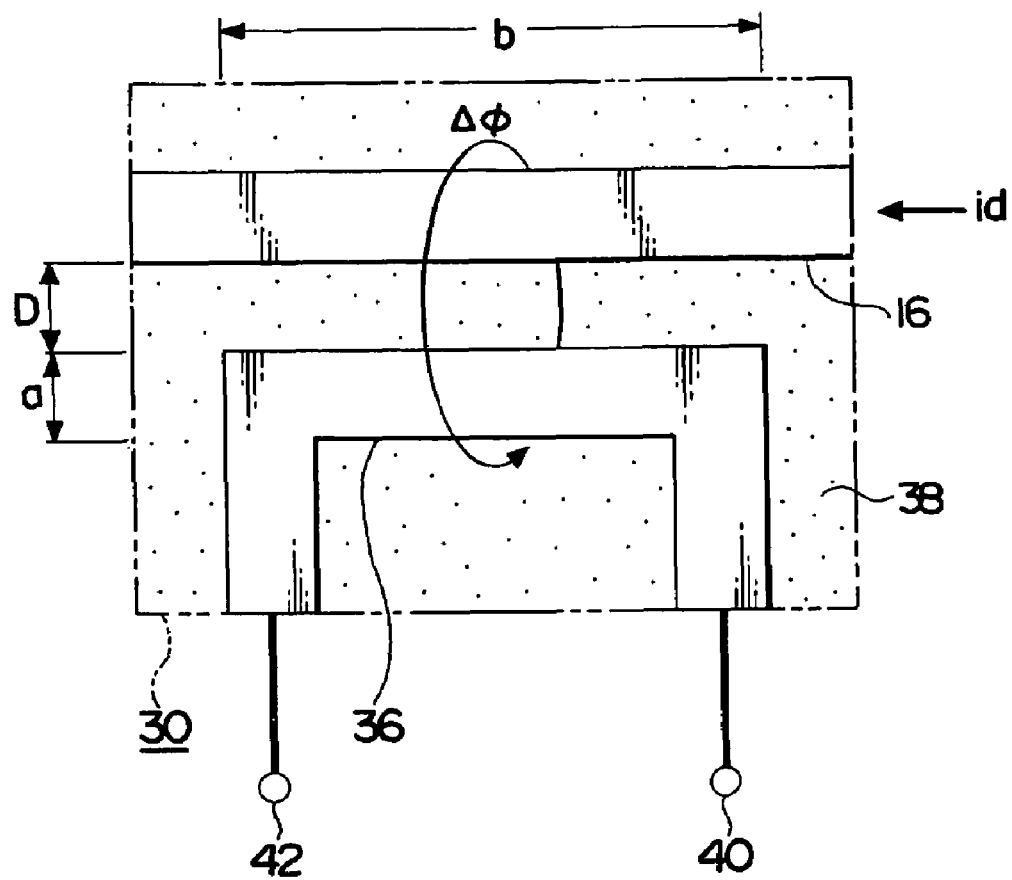
FIG. 2 is a drawing showing an example of a current detection part of the FL tube lighting device.

Next, the current detection part 30 is explained by referring to FIG. 2. FIG. 2 shows an example of the current detection part 30. The current detection part 30 is constituted by the current detection line 36 having the same wiring pattern as the circuit wiring 16 provided on a printed circuit board 38, and, in this embodiment, the wiring patterns of the circuit wiring 16 and the current detection line 36 constitutes parallel patterns. That is, the current detection line 36 having a straight-line segment parallel with the circuit wiring 16 in a straight-line form is disposed, and the magnetic flux change $\Delta\phi$ occurring to the circuit wiring 16 due to a change in the DC input current id is caused to act on the current detection line 36. In this case, a reference letter "a" is width of the current detection line 36, a reference letter "b" is length of the current detection line 36, and a predetermined insulating spacing D is set between the current detection-line 36 and the circuit wiring 16. Sensitivity in detection of the magnetic flux change $\Delta\phi$ is enhanced by rendering the insulating spacing D narrower.

The current detection line 36 is provided with detection terminals 40, 42, for taking out a voltage, generated through the agency of the magnetic flux change $\Delta\phi$, and a detection voltage obtained across the detection terminals 40, 42 is fed to a current change detection part 32 for detecting change in circuit current. In case of this embodiment, the current change detection part 32 is provided with a diode 44 serving as a conversion part for rectifying the detection voltage to be converted into a DC level, and the diode 44 is connected to the detection terminal 40 side of the current detection part 30 while a capacitor 46 as a filter circuit together with a resistor 48 constituting a adjustment part of a detection level are connected between the cathode side of the diode 44 and the detection terminal 42. For the diode 44, use is made of, for example, a Schottky diode having short reverse recovery time in order to cope with detection of current change due to disconnection discharge and so forth. The current change detection part 32 of such a configuration as described is constituted as a current-voltage conversion part for converting a change in the circuit current into a change in a DC voltage, so that the DC voltage corresponding to the change in the circuit current is obtained at the capacitor 46 and the resistor 48, and a voltage level thereof represents the change in the circuit current, which is a change in the DC input current id in this case.

A detection signal from the current change detection part 32 is fed to a comparator 34 constituting a detection signal output part. The comparator 34 is, as well as an amplification part for amplifying the detection signal, a decision part for determining on the basis of a change level of the detected circuit current whether or not the behavioral anomaly exists, comparing the detection signal with a predetermined level displaying the behavioral anomaly. In this case, the predetermined level represents a reference level with which it is possible to determine that there exists behavioral anomaly such as, for example, disconnection discharge of the circuit wiring, proximity discharge (dielectric breakdown discharge) between high voltage and low voltage parts of the circuit wiring, and so forth, and the predetermined level may be set at any level such as a level at the time of normal behavior, a level slightly higher than the level at the time of normal behavior, and so forth, provided that determination on whether the behavior of the inverter is anomalous or normal can be made. Accordingly, the comparator 34 compares the detection signal with the predetermined level, outputting a detection signal Vs that turns to a low (L) level displaying normal when, for example, a detection voltage level is not higher than the predetermined level, and a detection signal Vs that turns to a high (H) level displaying anomaly when the detection voltage level exceeds the predetermined level. The detection signal Vs is fed to the latch input terminal 28 of the inverter control part 20, and is used for maintaining operation of the inverter control part 20 at the time of normal while stopping the operation of the inverter control part 20 at the time of anomaly. With the present embodiment, the switch 26 is caused to open at the time of anomaly by the detection signal Vs fed to the latch input terminal 28. Thereby, supply of power to the inverter control part 20 is cut off, and operation of the inverter 2 is controlled so as to be in the off condition.

Further, circuit wirings 52, 54 are connected to a secondary winding 50 of an inverter transformer 22, thereby constituting a current route of output current. A ballast capacitor 56 is interposed within one of the circuit wirings 52, and is connected to a connector 58 as an AC output terminal while a constant current detection resistor 60 is interposed within the other of the circuit wirings 54, and is connected to a connector 62 as an AC output terminal. An FL tube 4, which is a load, is connected to the respective connectors 58, 62, constituting a backlight of an LCD 64. The ballast capacitor 56 constitutes a stabilization part for stabilizing tube current flowing in the FL tube 4, and the tube current detected by the constant current detection resistor 60 is fed to the inverter control part 20 side to be used for keeping the tube current constant. Accordingly, as a switching action of the inverter control part 20, AC is generated by a DC to AC conversion action thereof, and at the same time, high frequency output at high voltage is provided to the secondary winding 50 of the inverter transformer 22 due to step-up in voltage of the inverter transformer 22. This high voltage output is fed to the FL tube 4 via the circuit wirings 52, 54, and the connectors 58, 62, respectively.

The present embodiment shows a case where the single FL tube 4 is connected to the single secondary winding 50. However, a plurality of FL tubes may also be installed, and, in that case, the ballast capacitor 56 is installed for every FL tube.

Figure 3A:
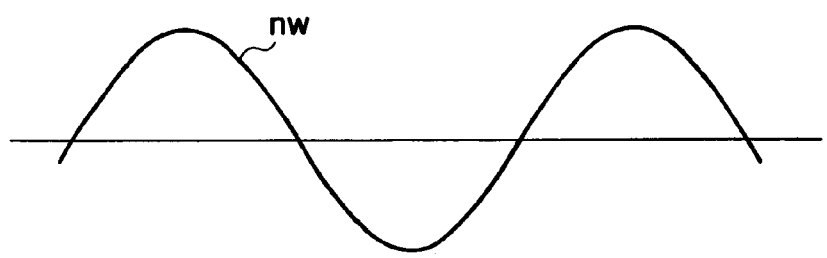
FIG. 3A is a drawing showing a waveform at the time of normal behavior of the FL tube lighting device.
Figure 3B:
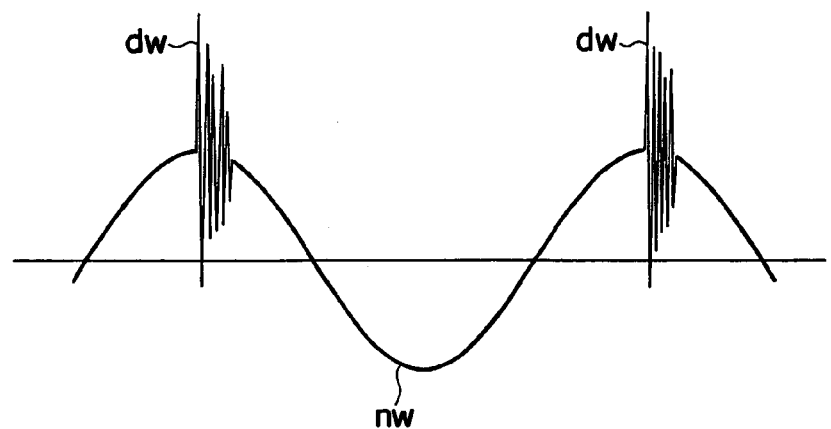
FIG. 3B is a drawing showing a waveform at the time of behavioral anomaly of the FL tube lighting device.
Figure 4:
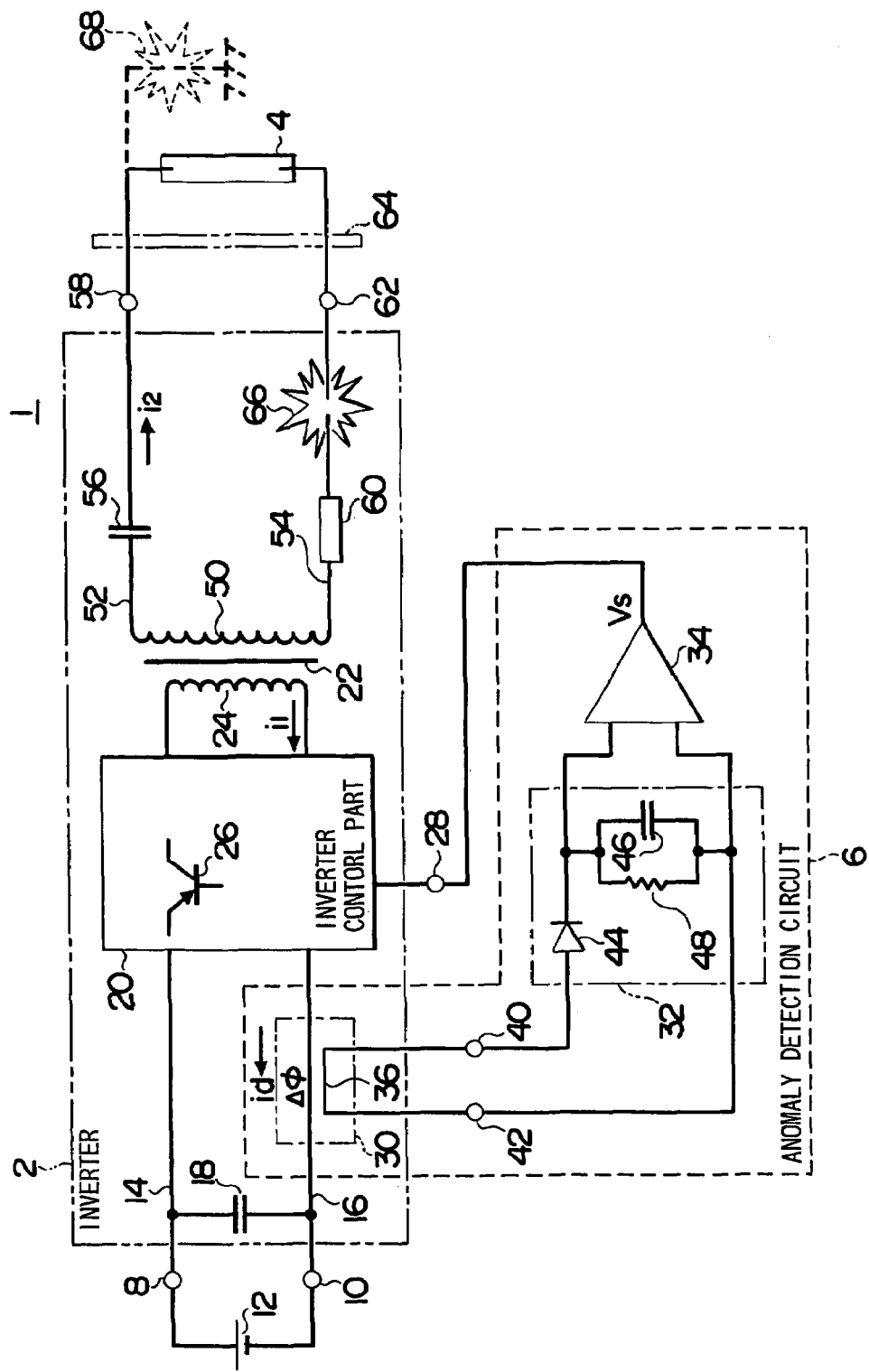
FIG. 4 is a circuit diagram showing the FL tube lighting device at the time of anomaly.

Next, operation of the FL tube lighting device is explained by referring to FIG. 3 and FIG. 4. FIG. 3A shows an operating waveform at the time of a normal condition, FIG. 3B shows an operating waveform at the time of an anomalous condition, and FIG. 4 shows a case that disconnection discharge or ground-fault discharge is occurring in a current route.

Upon driving the FL tube 4 with a constant current by use of the inverter 2 as described above, the FL tube 4 is lit up with a constant driving current. In the case of normal behavior, a behavior waveform of AC output will be a sinusoidal waveform nw as shown in FIG. 3A, however, if a break occurs to, for example, the circuit wiring 54 as shown in FIG. 4, discharge occurs to a spot 66 of the break, thereby maintaining a current route. A behavior waveform at the time of such an anomalous behavior as above will be an anomalous waveform composed of the sinusoidal waveform nw occurring at the time of the normal behavior with a discharge waveform dw superimposed thereon as shown in FIG. 3B. The discharge waveform dw represents a noise (high frequency) undergoing an abrupt change from a fundamental waveform of the gently-sloping AC output and having a high frequency component, however, such a waveform component does not cause an increase in amperage of the circuit current, but only causes an increase in change increment of the circuit current. Further, the discharge waveform dw occurs periodically in relation to a change in level of the sinusoidal waveform nw occurring at the time of the normal behavior. Such a phenomenon as described occurs to not only current waveform but also voltage waveform, however, it has been confirmed on the basis of experiments that change occurring to current waveform is greater than that for voltage waveform.

If a current route is maintained due to the discharge described, there occurs a rapid change to circuit current including output current $i_2$ of the inverter transformer 22, input current $i_1$ of the inverter transformer 22, the DC input current $i_d$, drive current inside the inverter control part 20, and so forth, so that an intense magnetic flux change $\Delta\phi$, displaying an abrupt change in circuit current, occurs around the circuit wirings 14, 16, constituting the current route. Hereupon, an abrupt magnetic flux change $\Delta\phi$ is detected by the current detection line 36, and a high voltage displaying a change in the circuit current is generated across both ends of the current detection line 36. Since the high voltage is rectified by the diode 44 and smoothed out by the capacitor 46, a DC voltage at a level displaying an abrupt change in current can be obtained at the time of discharge. The DC voltage is fed to the comparator 34, and is compared with the predetermined level, whereupon the comparator 34 obtains the detection signal Vs that displays whether the behavior is normal or anomalous.

When the detection signal Vs is fed to the latch input terminal 28 of the inverter control part 20 as an output of the stop of the operation, the switch 26 of the inverter control part 20 is turned into the off condition, thereby stopping inverter operation and canceling AC output, whereupon the FL tube 4 is turned into unlit condition, and at the same time, continuation of discharge is interrupted. As a result, the inverter 2 and the FL tube 4 are released from continuation of behavioral anomaly.

In case that a discharge 68, displayed by a broken line in FIG. 4, occurs due to dielectric breakdown and so forth, caused by proximity between a high voltage part on the AC output side and a low voltage part on a chassis, and so forth, a behavior waveform at that time will become an anomalous waveform composed of the sinusoidal waveform nw occurring at the time of the normal behavior with the discharge waveform dw superimposed thereon as shown in FIG. 3B as with the case of disconnection discharge.

In this case as well, an abrupt change in circuit current of the circuit wiring 16 causes a magnetic flux change $\Delta\phi$ to occur. The magnetic flux change $\Delta\phi$ is detected by the current detection line 36 of the current detection part 30, and consequently, the comparator 34 obtains a detection signal Vs displaying behavioral anomaly. As a result, the inverter operation by the inverter control part 20 is stopped and AC output is cancelled, whereupon the FL tube 4 is turned into unlit condition, and at the same time, continuation of discharge is interrupted. Similarly, the inverter 2 and the FL tube 4 are released from continuation of behavioral anomaly.

With the present embodiment, since the current detection part 30 is installed on the input current side of the inverter control part 20, it is possible to detect through the medium of the magnetic flux change $\Delta\phi$ a rapid change in the input current, occurring due to behavioral anomaly caused by disconnection discharge, dielectric breakdown discharge, etc. in the current route on the output side, thereby causing a high voltage representing behavioral anomaly to occur across the detection terminals 40, 42. That is, the present embodiment is easier to cope with insulation as compared with the case of detecting behavioral anomaly on the high voltage side, and is also excellent in safety.

Further, with a very simple configuration wherein the current detection line 36 is disposed in parallel with the circuit wiring 16, it is possible to generate a voltage displaying a rapid change in the circuit current because a change in the circuit current is detected through the medium of the magnetic flux change $\Delta\phi$, and in addition, to take out the change in the circuit current at high voltage. That is, sensitivity in detection of the change in circuit current is high and behavioral anomaly can be detected with high accuracy.

Further, although it is possible to detect behavioral anomaly in such as discharge and so forth from the change in voltage, the change in the circuit current is detected through the medium of the magnetic flux change $\Delta\phi$, so that the accuracy of detection is enhanced. That is, the change in waveform caused by discharge is larger in the change in current waveform rather than the change in voltage waveform, and the magnetic flux change $\Delta\phi$ occurs due to this change in current, and hence the accuracy of detection of behavioral anomaly through the medium of the magnetic flux change $\Delta\phi$ is enhanced.

When detecting the change in the circuit current through the medium of the magnetic flux change $\Delta\phi$, the magnetic flux change $\Delta\phi$ can be detected with ease by a very simple configuration having the current detection line 36 which is arranged in parallel with the circuit wiring 16, and further the current detection line 36 can be installed without adding any change in the circuit condition at the inverter 2 side, and also it is possible to configure the circuit arrangement of the current change detection part 32 and the comparator 34 irrespective of the inverter side circuit in response to a high voltage generated at the detection terminals 40, 42, and hence the circuit configuration can be designed with ease.

Further, the current change detection part 32 can obtain a DC voltage having a level necessary for determining whether a high voltage obtained at the detection terminals 40, 42 is normal behavior, or behavioral anomaly caused by discharge with a simple circuit configuration and processing such as rectification by the diode 44, the smoothing out by the capacitor 46, and so forth. That is, it is possible to generate a DC voltage in which normal behavior or behavioral anomaly caused by discharge clearly appears in the difference of level thereof. Accordingly, the comparator 34 can easily set a reference level for sharply differentiating between normal behavior and behavioral anomaly, and hence the accuracy of detection is high and behavioral anomaly can be detected without an erroneous operation.

When the detection signal Vs obtained by the comparator 34 is fed to the latch input terminal 28 of the inverter control part 20, the operation of the inverter control part 20 is stopped at the time of behavioral anomaly, and thereby the load such as the inverter 2, the FL tube 4 and the LCD 64 can be protected from continuation of behavioral anomaly.

Meanwhile, it is confirmed, according to an experiment, for the occurrence of detection voltage at the current detection line 36 which is irrespective of disconnection discharge or dielectric breakdown discharge, that the current detection line 36 can detect the variation in voltage caused by the change in circuit current due to very small discharge by setting a circuit condition therein such that use is made of, for example, a Schottky diode having short reverse recovery time serving for the diode 44 of the current change detection part 32, and the resistor 48 has a resistance value in the order of, for example, 0.1 MΩ to 5 MΩ, the capacitor 46 has an electrostatic capacitance in the order of 0.0015 µF to 0.1 µF, and so forth. As a result, it is possible to detect an anomalous condition such as disconnection discharge, dielectric breakdown discharge or ground-fault discharge, and also possible to prevent easily an erroneous operation caused by excessive current when power is turned on, and so forth. In this case, although concrete circuit conditions of the diode 44, the capacitor 46, the resistor 48 used in the experiment are exemplified, they can be arbitrarily set, and the invention is not limited to such circuit conditions.

Figure 5A:
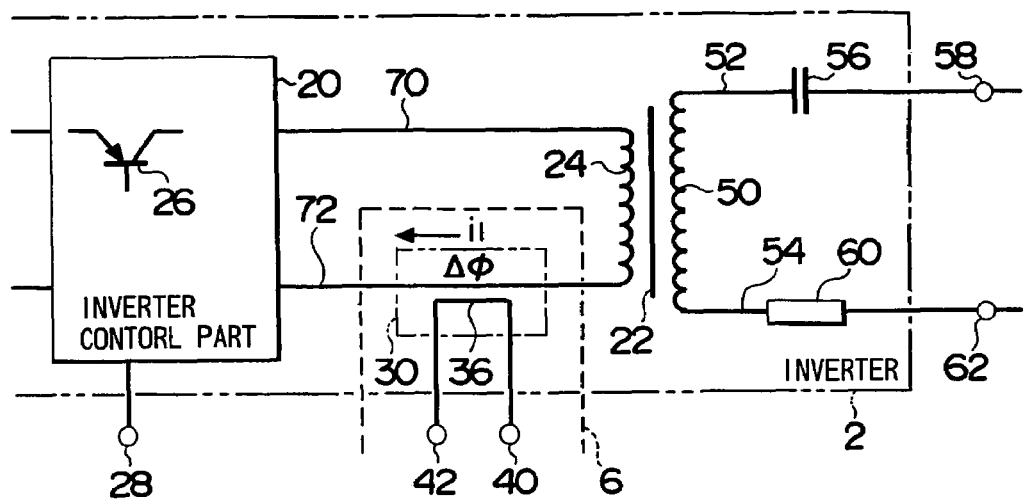
FIG. 5A is a circuit diagram showing a case where a primary winding of an inverter transformer is served as a current detection point, as another part of the current detection point.
Figure 5B:
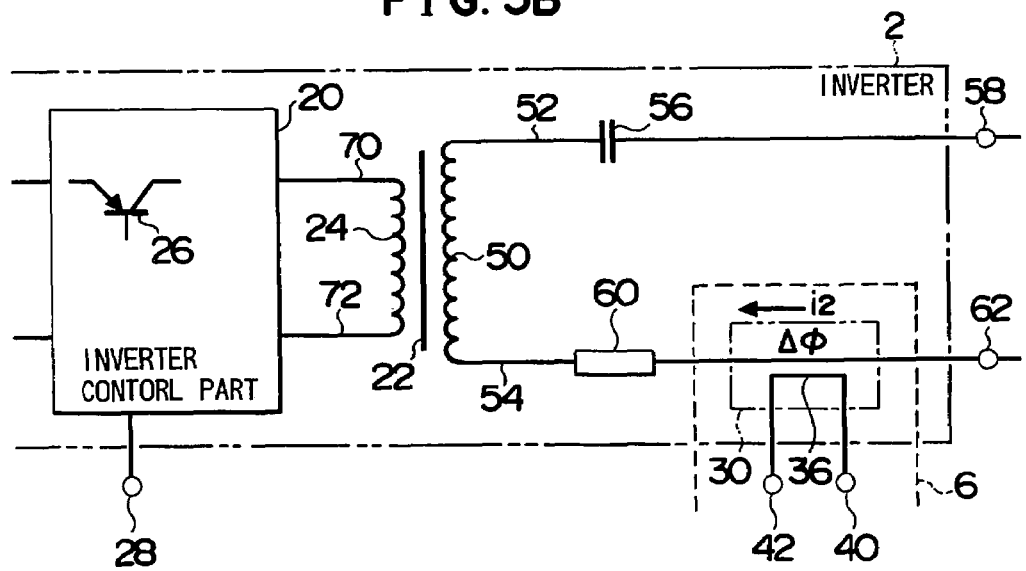
FIG. 5B is a circuit diagram showing a case where a secondary winding of an inverter transformer is served as a current detection point, as another part of the current detection point.

Next, a current detection point at which change in a circuit current is detected is explained by referring to FIG. 5. FIG. 5A shows a case that the current detection point is set to a primary side of the inverter transformer, and FIG. 5B shows a case that the current detection point is set to a secondary side of the inverter transformer.

The current detection point, as shown in FIG. 5A as an example other than the circuit wiring 16 shown in FIG. 1, may be set to circuit wirings 70, 72 respectively connected to a primary winding 24 of the inverter transformer 22, the current detection part 30 is installed in the circuit wiring 72, and a current detection line 36 may be arranged in the vicinity of the circuit wiring 72. Further, as shown in FIG. 5B, circuit wirings 52, 54 connected to a secondary wiring 50 of the inverter transformer 22 may be set as a current detection point, and, for example, a current detection part 30 is installed in the circuit wiring 54 and a current detection line 36 may be arranged in the vicinity of the circuit wiring 54. When the current detection line 36 is arranged in the vicinity of the circuit wiring 72, behavioral anomaly can be detected through the medium of the magnetic flux change $\Delta\phi$ due to the change in a primary current namely an input current $i_1$ which flows in the circuit wirings 70, 72 at the side of the primary winding 24 of the inverter transformer 22, thereby stopping the inverter operation.

Further, if the current detection line 36 is arranged in the vicinity of the circuit wiring 54, the change in an output current $i_2$ can be detected through the medium of the magnetic flux change $\Delta\phi$ caused by the change in the output current $i_2$ which is the secondary current of the inverter transformer 22 flowing through the circuit wiring 54, and the inverter operation can be stopped at the time of behavioral anomaly, and hence an inverter 2, an FL tube 4 and so forth can be protected from continuation of behavioral anomaly such as discharge and so forth. In this case, the change in a wave form is larger at the output side of the inverter transformer 22 compared with that at the input side thereof, and also the change value of the discharge waveform is remarkably increased. Because of this, a circuit current change and a magnetic flux change are larger, and the accuracy of detection is enhanced.

Figure 6A:
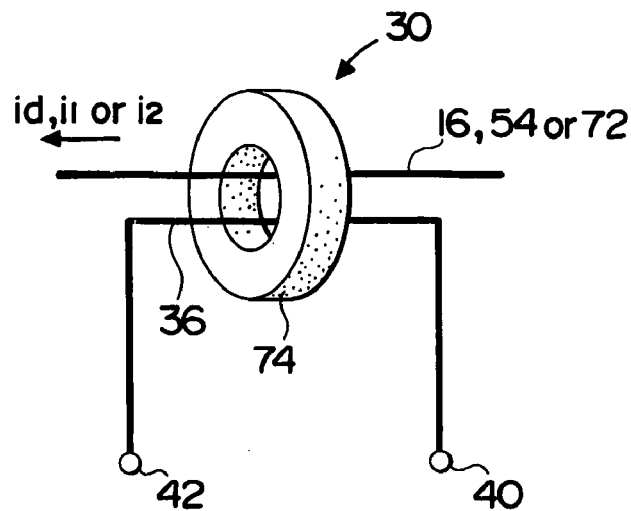
FIG. 6A is a perspective view showing a case where a core is used as a current detection part.
Figure 6B:
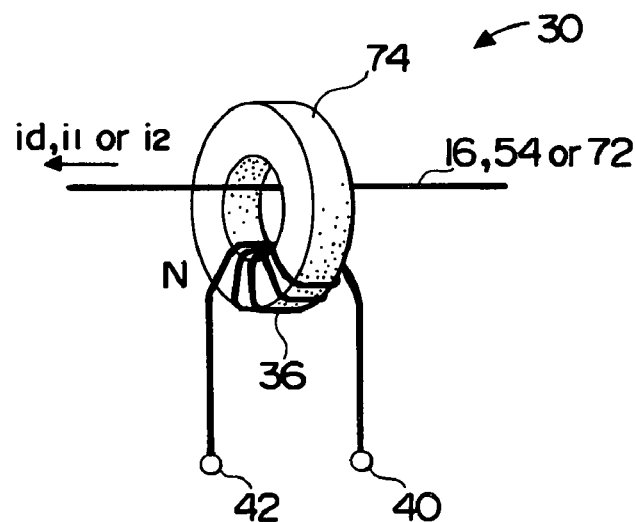
FIG. 6B is a perspective view showing a case where a current detection line wound around a core is used as a current detection part.
Figure 6C:
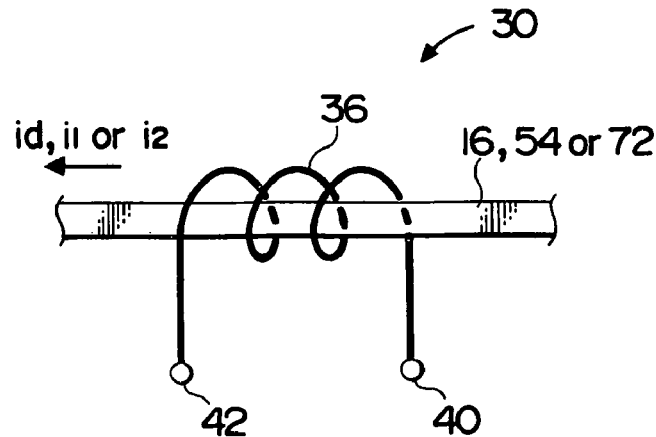
FIG. 6C is a drawing showing a case where a current detection line wound around a circuit wiring is used as a current detection part.

Next, other embodiments of current detection part 30 are explained by referring to FIG. 6. FIG. 6A shows a current detection part 30 which is constituted by using a core, FIG. 6B shows a current detection part 30 which is constituted by winding a current detection line around a core, and FIG. 6C shows a current detection part 30 which is constituted by winding the current detection line 36 around the circuit wiring 16, 54 or 72.

In connection with an embodiment of a current detection part 30, as shown in FIG. 6A as an example, a ring-shaped core 74 is installed in the current detection part 30. Circuit wirings 16, 54 or 72 and a current detection line 36 are allowed to pass in the core 74, and a common magnetic path which passes magnetic flux $\phi$ may also be formed in the current detection line 36 together with the circuit wirings 16, 54 or 72 with the core 74. When using the core 74, the change in magnetic flux change $\Delta\phi$ can be intensified by magnetic permeability µ of a magnetic material forming the core 74, and also a detection voltage of the detection terminals 40, 42 can be increased, thereby enhancing sensitivity in detection.

Further, for example, a current detection line 36 may be wound around a core 74 as shown in FIG. 6B. In this case, magnetic flux change $\Delta\phi$ acting on the current detection line 36 is intensified by the number of turns N, and detection voltage generated in detection terminals 40, 42 is stepped up, thereby taking out higher detection voltage. In this case, circuit wirings 16, 54 or 72 may be wound around the core 74. Further, a cylindrical core may be used as the core 74, and even with the cylindrical core, a common magnetic path can be formed in the circuit wirings 16, 54 or 72 and a current detection line 36.

Still further, for example, a current detection line 36 is wound around the circuit wirings 16, 54 or 72 by several numbers of winding, as shown in FIG. 6C, so that the magnetic flux change $\Delta\phi$ occurring to the circuit wirings 16, 54 or 72 may act on the current detection line 36. With such a configuration, detection voltage corresponding to the number of turns of the current detection line 36 can be taken out between the detection terminals 40, 42. With a configuration having no such a core 74, the number of parts is decreased, and hence the current detection part 30 can be manufactured at low price. According to the anomaly detection circuit 6 of the inverter 2 having no the core 74, as shown in FIGS. 1, 4 and 5, the same effect as made here can be obtained.

Figure 7:
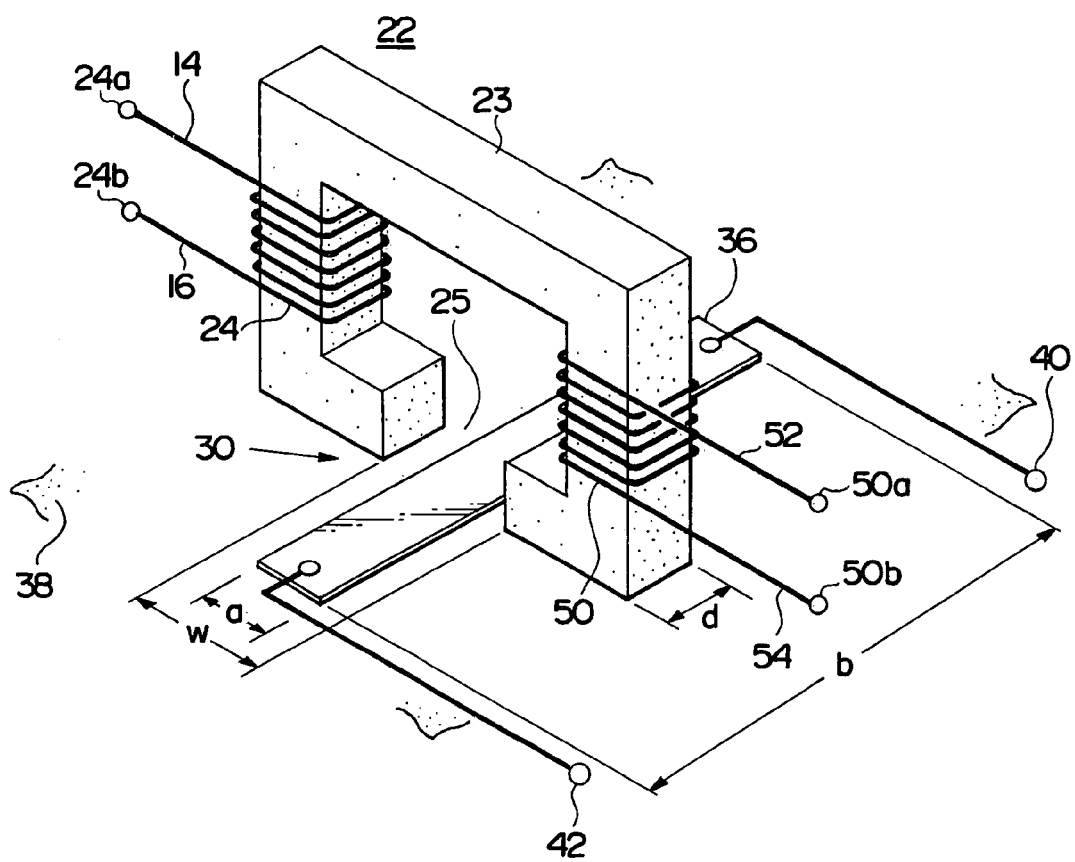
FIG. 7 is a drawing showing another embodiment of a current detection part.
Figure 8:
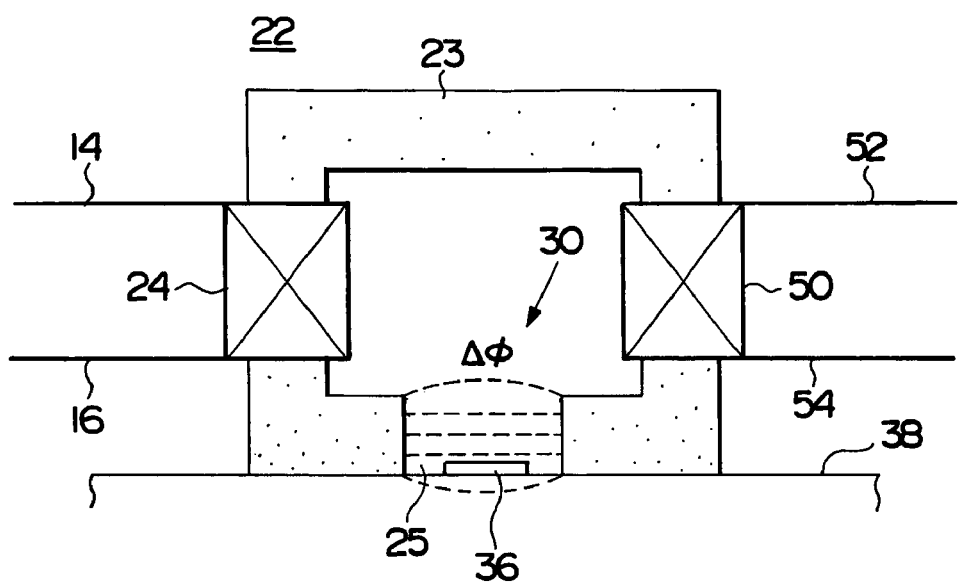
FIG. 8 is a drawing showing a construction which detects leakage flux of a core gap of an inverter transformer.

Next, another embodiment of the current detection part 30 is explained by referring to FIG. 7 and FIG. 8. FIG. 7 shows a current detection part 30 which is provided adjacent to an inverter transformer, and FIG. 8 shows the detection of a magnetic flux change caused by a discharge current.

An inverter transformer 22 used in the inverter 2 has a gap 25 which is formed in a core 23, and is provided so that the gap 25 is positioned in the side of a printed circuit board 38. Therefore, a current detection line 36 is provided on the printed circuit board 38 at a space of the gap 25 by means of a wiring pattern. In other words, the current detection line 36 which has width "a" narrower than a space "w" of the core 23 and length "b" is formed on the printed circuit board 38, the core 23 of the inverter transformer 22 is provided astride of the printed circuit board 38, and the current detection line 36 is arranged in the space of the gap 25. Although the length "b"

of the current detection line 36 is set larger than width "d" of the core 23, it may also be set to the same length (b=d). Further, to the inverter transformer 22, a primary winding 24 and a secondary winding 50 are provided. Terminals 24a and 24b of the primary winding 24 are connected to the inverter control part 20, one terminal 50a of the secondary winding 50 is connected to the ballast capacitor 56 (FIG. 1), and the other terminal 50b is connected to the constant current detection resistor 60.

In a construction like this, for example, if electric discharge occurs in a current route of the secondary winding 50 side of the inverter transformer 22, as shown in FIG. 8, a severe magnetic flux change $\Delta\phi$ occurs in the gap 25 by its discharge current. This magnetic flux change $\Delta\phi$ acts on the gap 25 and the current detection line 36 adjacent to the gap 25 and is detected by the current detection line 36, and a detected voltage which is on a high level representative of change in a circuit current ($i_d$) is taken out. This detected voltage is given to the current change detection part 32, and is used for the inverter control and so on.

Figure 9:
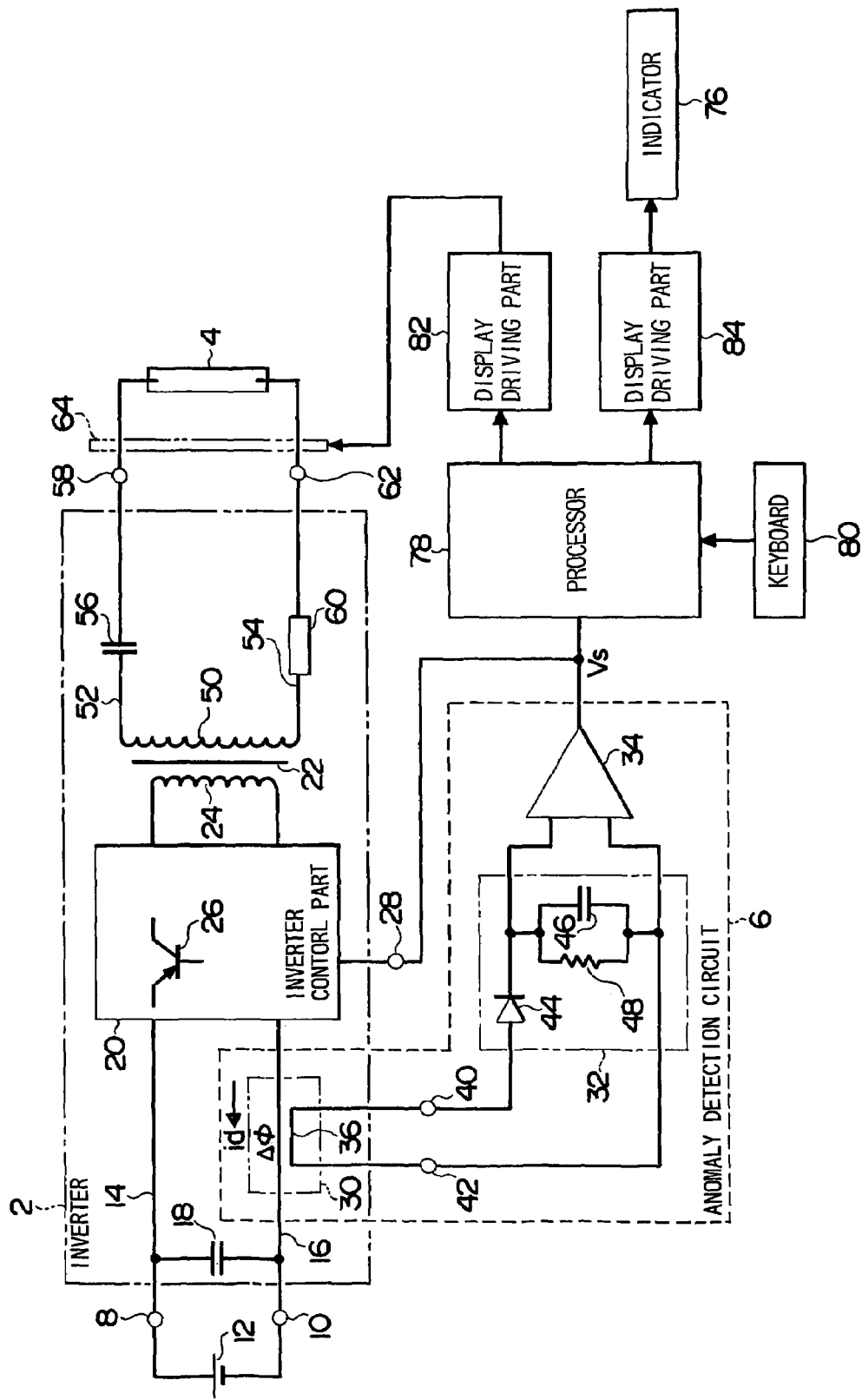
FIG. 9 is a circuit diagram showing an embodiment of a display device according to the present invention.

Next, an embodiment of a display device according to the present invention is explained by referring to FIG. 9. FIG. 9 shows a display device using the anomaly detection circuit of the inverter according to the present invention.

In the display device, the configurations, operations and effects of the inverter 2 and the anomaly detection circuit 6 are the same as those described with reference to FIGS. 1 to 8.

With the display device in FIG. 9, an LCD 64 and an indicator 76 which constitute a display part displaying an anomaly at the time of anomalous behavior are installed, and a processor 78 is installed as a display control part of these LCD 64 and indicator 76. The processor 78 constitutes a processing part for executing a control program for displaying behavioral anomaly stored in a storage part, not shown, wherein a detection signal Vs obtained by a comparator 34 is fed to the processor 78 and a keyboard 80 is connected to the processor 78 through which instruction input for executing behavioral anomaly verification processing is inputted. An display driving part 82 is installed in the LCD 64 for executing predetermined display upon reception of a display control output from the processor 78 and an display driving part 84 is installed in the indicator 76.

Figure 10:
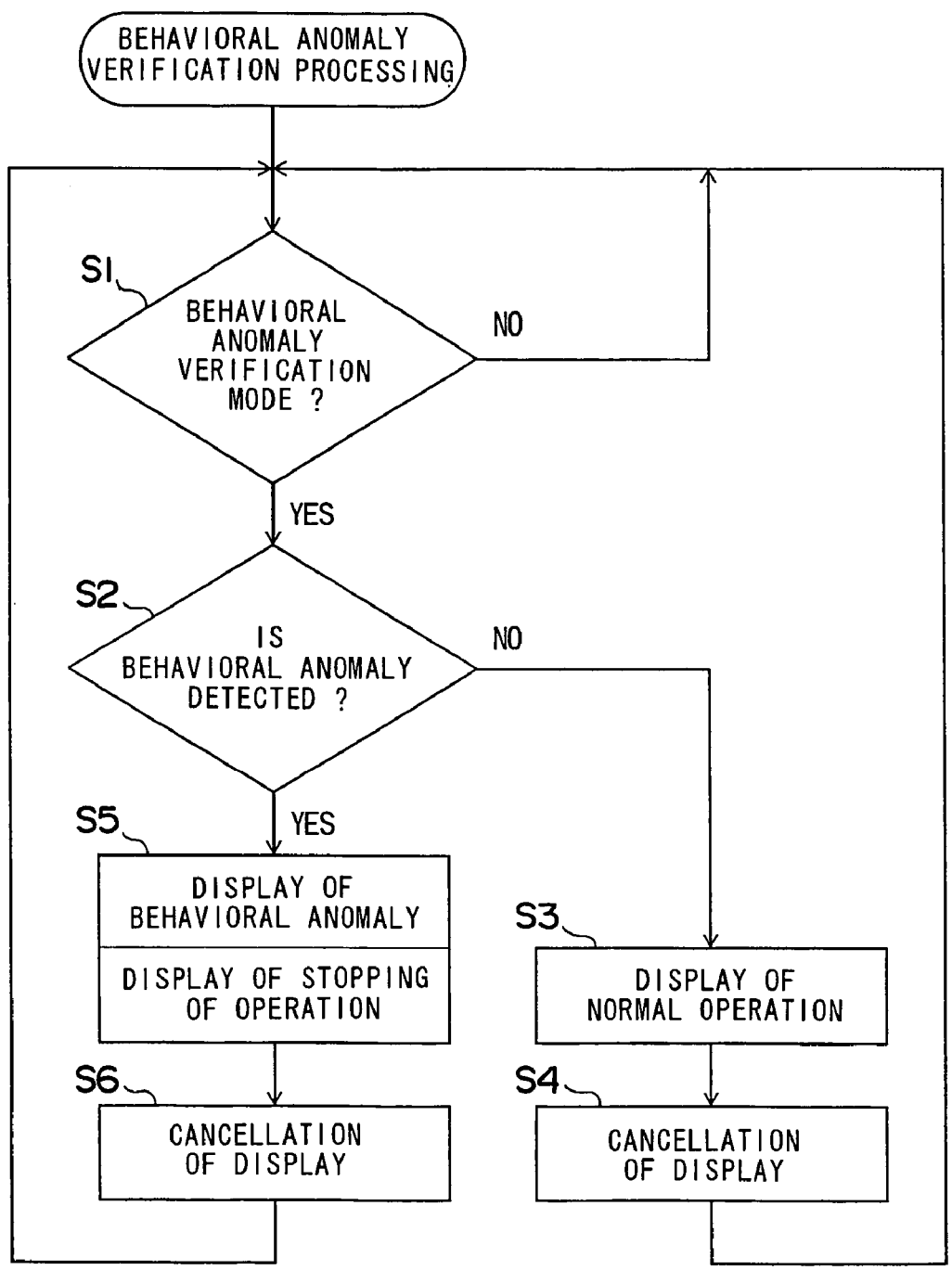
FIG. 10 is a flow diagram showing behavioral anomaly verification processing.

Operation of this display device is explained by referring to FIG. 10. FIG. 10 is a flow diagram showing behavioral anomaly verification processing. In the verification processing of behavioral anomaly, by a start of that processing, it is determined whether or not the inverter is in behavioral anomaly verification mode (a step S1). In this case, when a specific key of the keyboard 80 or an instruction assigned to multiple keys thereof are operated, the behavioral anomaly verification mode is set. In this case, a behavioral anomaly verification mode is automatically set when power is turned on, anomaly of the inverter 2 may be confirmed. When the behavioral anomaly verification mode is established, the detection signal Vs from the comparator 34 is received, and whether or not behavioral anomaly is detected is decided (a step S2).

At the time of the normal condition, it is displayed on the LCD 64 or the indicator 76 that behavioral anomaly does not exist, namely, a normal behavior is performed (a step S3). When a predetermined time elapses from the start of the display of the normal behavior or an administrator instructs an operation display cancel from the keyboard 80, the display operation is cancelled (a step S4), and, after that, the processing is returned to the step S1.

When behavioral anomaly is detected in the step S2, the behavioral anomaly is displayed on the LCD 64 or the indicator 76 and the stop of operation of the inverter 2 is displayed on the same (a step S5). The administrator verifies these displays, and executes necessary processing. For example, when a predetermined time elapses from the start of the display of behavioral anomaly or the administrator instructs an operation display cancel from the keyboard 80, the display cancel is effected (a step S6), and, after that, the processing is returned to the step S1. In this case, when behavioral anomaly is displayed, the display cancel may not be effected unless the administrator effects an improvement processing.

When the FL tube 4 namely a light source of the LCD 64 is lit out, it is expected that content of the display of the LCD 64 is hardly verified. Therefore, although the verification or confirmation of anomaly or a stop of the inverter 2 becomes easy by the indicator 76 when displaying behavioral anomaly or the inverter 2 stops its operation, it is possible to use the LCD 64 for displaying the behavioral anomaly or the stop of the operation of the inverter 2. When the FL tube 4 is in unlit condition, and the display of such a condition can be verified, the indicator 76 is not always needed. If the display is effected using both the LCD 64 and the indicator 76, a reliability of the stop of operation and the display thereof can be enhanced.

Next, embodiments of an information processing device, an electronic device and so on according to the present invention are explained by referring to FIG. 11. FIG. 11A shows a cellular phone according to the embodiment, and FIG. 11B shows a note type personal computer according to the embodiment. These cellular phone and note type personal computer constitute the information processing device, the electronic device and so on which are configured to use the anomaly detection circuit of the inverter or display device according to the invention.

With the information processing device, the electronic device and so on shown in FIGS. 11A and 11B, an FL tube 4 is installed, as a backlight of an LCD 64 serving as a display device, in a housing 90 of a cellular phone 86 or a note type personal computer 88. Further, along with the inverter 2 shown in FIG. 1 or 4 and the anomaly detection circuit 6 of the inverter 2 according to the invention as a driving device of the FL tube 4, a processor 78 as an arithmetic and control part, a keyboard 80 and so forth are incorporated therein. In this case, an indicator 76 serving as an display element is installed inside the housing 90 of the cellular phone 86 or the note type personal computer 88 for use in maintenance thereof, and it can be installed on an outer face of the housing 90.

With such a configuration, in the information processing device, the electronic device and so on of the cellular phone 86, the note type personal computer 88 and so forth, behavioral anomaly such as a disconnection discharge, dielectric breakdown discharge of the circuit wirings 14, 16, circuit wirings 52, 54, circuit wirings 70, 72 of the inverter 2 respectively, and so forth can be monitored, and when the operation of the information processing device is stopped, the information processing device, the electronic device and so on can be protected from continuation of behavioral anomaly. Further, since the behavioral anomaly or the stop of the operation is displayed on the LCD 64 or the indicator 76, the behavioral anomaly or the stop of operation can be quickly detected from the display thereof, thereby realizing a high reliable information processing device, the electronic device and so on. Further, anomaly such as disconnection discharge, dielectric breakdown discharge of the circuit wirings 14, 16 and so forth of the inverter 2 can be easily determined from the content of the display, and hence necessary measures can be executed quickly, thereby providing the information processing device, the electronic device and so on having high safety.

Figure 12:
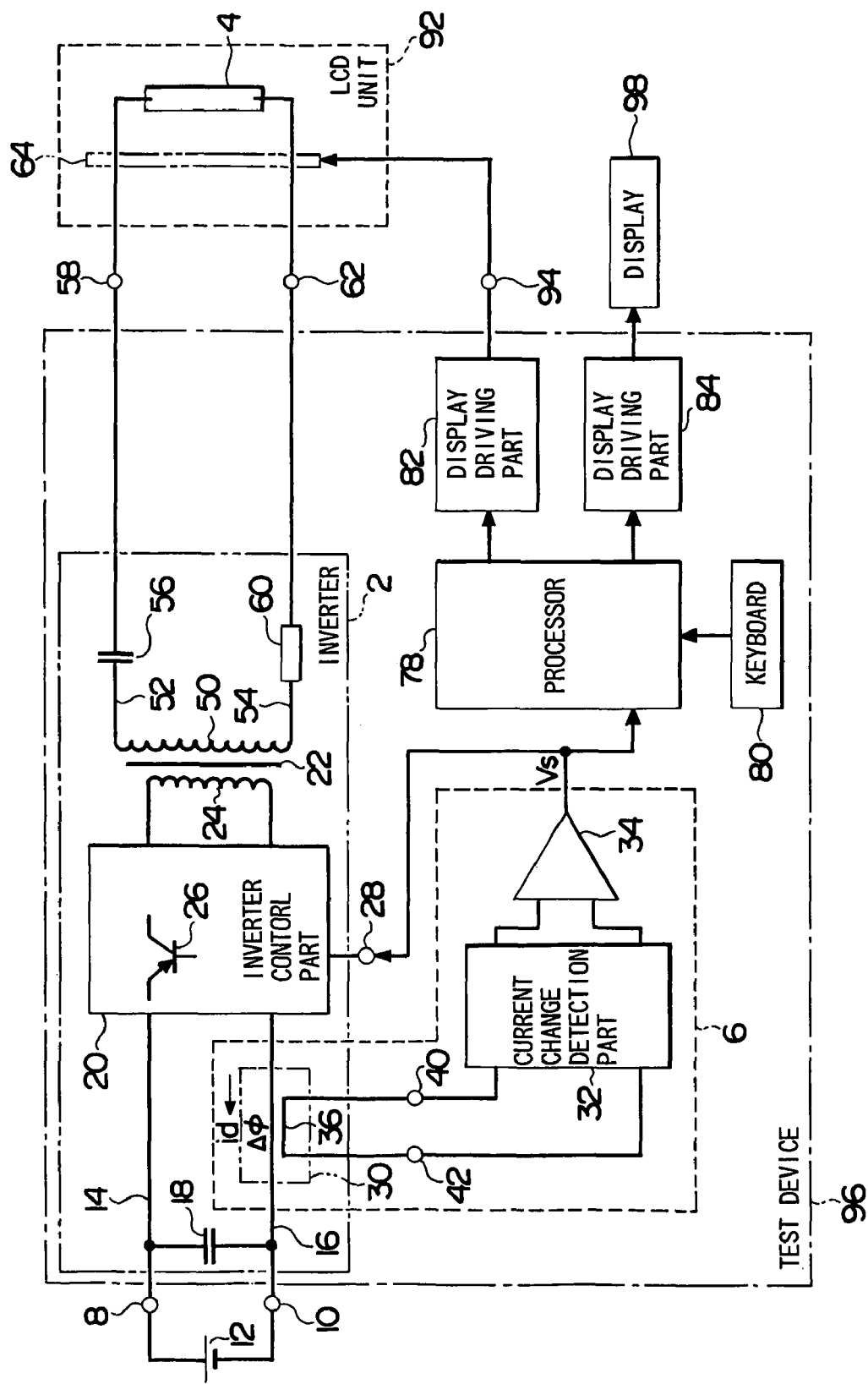
FIG. 12 is a drawing showing an embodiment of a test device according to the present invention.
Figure 13:
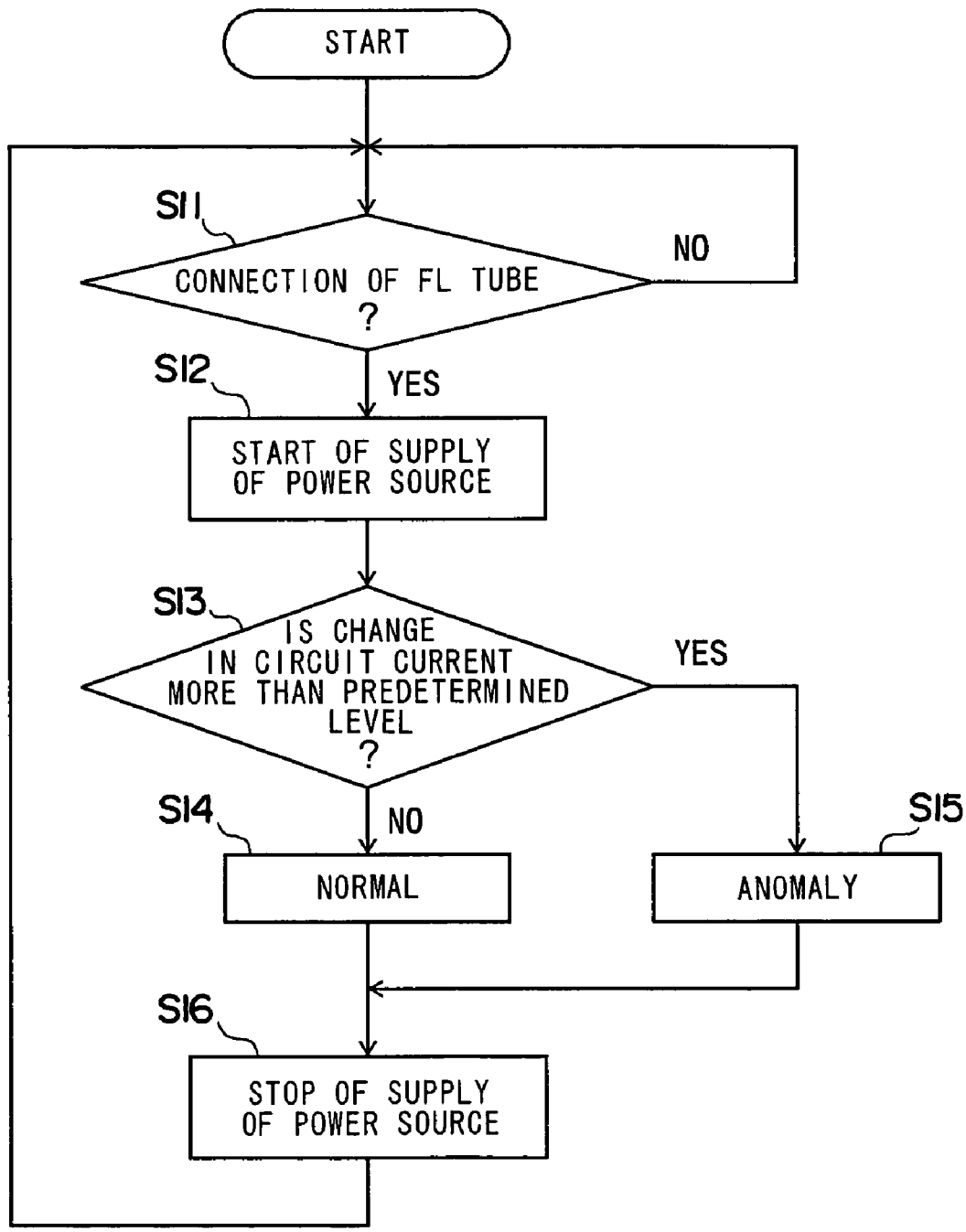
FIG. 13 is a flow diagram showing procedure of a test.

Next, an embodiment of a test meted and a test device according to the present invention are explained by referring to FIG. 12 and FIG. 13. FIG. 12 is a drawing showing the test device according to the embodiment, and FIG. 13 is a flow diagram showing procedure of a test.

A liquid crystal display unit 92 is used as a test object. In this case, the liquid crystal display unit 92 has an LCD 64 and an FL tube 4, connectors 58 and 62 are provided to the FL tube 4, and a connector 94 is provided to the LCD 64.

A test device 96 of this liquid crystal display unit 92 has the inverter 2 providing the anomaly detection circuit 6 described before in FIG. 1, and also provides the processor 78 and the display driving parts 82 and 84 described before in FIG. 9. An output of the display driving part 84 is given to a display 98, and a test result is displayed on the display 98. Other construction is the same as the construction shown in FIG. 1 and FIG. 9.

On the occasion of the test of the liquid crystal display unit 92, an alternating current output part of the inverter 2 of the test device 96 is connected to the connectors 58 and 62, and an output part of the display driving part 82 is connected to the connector 94.

Referring to the flow diagram shown in FIG. 13, if the test is started, whether or not the FL tube 4 is connected to the test device 96 is decided (a step S11), and the supply of a power source to the FL tube 4 from the inverter 2 is started if the FL tube 4 is connected (a step S12). As a result of the supply of the power source, whether or not change in a circuit current is more than a predetermined level is decided (a step S13). If disconnection discharge or ground-fault discharge does not occur in a current route of the side of the FL tube 4 which is a load, the change in the circuit current due to its discharge current does not occur, and the change in the circuit current becomes under the predetermined level. The detection of this change in the circuit current is as described before. In this case, a detected output of the anomaly detection circuit 6 is given to the processor 78 from a comparator 34, the processor 78 decides that the unit 92 is a normal condition, and a result of that decision representative of the normal condition is displayed as a test result on the display 98 (a step S14). On the other hand, if the disconnection discharge or the ground-fault discharge occurs in the current route of the side of the FL tube 4 which is a load, great change in the circuit current occurs by its discharge current, and that change becomes above the predetermined level. The detection of this change in the circuit current is as described before. In this case, the detected output of the anomaly detection circuit 6 is given to the inverter control part 20, and an inverter output is stopped. At the same time, the detected output is given to the processor 78 from the comparator 34, the processor 78 decides that the unit 92 is an anomalous condition, and a result of that decision representative of the anomalous condition is displayed as a test result on the display 98 (a step S15). Then, after stopping the supply of the power source (a step S16), the liquid crystal display unit 92 which has finished the test is taken off from the test device 96, a next liquid crystal display unit 92 is connected to the test device 96, and the same test is performed.

According to the above-mentioned test device and test method, in respect to the liquid crystal display unit 92, the test can be performed without increasing the number of processes of the test and without doing special preparations. Further, it is possible to perform the test under a state that the condition of lighting of the liquid crystal display unit 92 is set to the same condition as the time of actual use. Therefore, it is possible to quickly and high-accurately test whether or not the disconnection discharge or the ground-fault discharge is in existence and even whether or not anomaly of the connectors 58, 62 and 94 is in existence. Furthermore, the test can be performed on a manufacturing line. Hence, it is possible to contribute to realization of a product having high reliability.

In the above-mentioned test device, the current detection part 30 is provided at the circuit wiring 16 of the input side of the inverter control part 20. However, the present invention is not intended to limit to this construction. The current detection part 30 may also be provided at the circuit wiring 52 or 54 of the secondary side of the inverter transformer 22, the change in a circuit current is detected through the medium of magnetic flux change $\Delta\phi$ due to the change in the circuit current, and anomaly of the FL tube 4, discharge of the current route and so on may also be decided. As described before, detecting the change in a circuit current of the secondary side of the inverter transformer 22 is advantageous for improvement of accuracy of detection.

Further, the present invention includes other embodiments and various kinds of electronic devices, in addition to the current detection method of an inverter, the current detection circuit thereof, the anomaly detection method thereof, the anomaly detection circuit thereof, the display device, the information processing device, the test method and the test device which have been described before.

(a) Although the comparator 34 for comparing a detection voltage with a predetermined level to output a detection signal is exemplified as the detection signal output part for outputting the detection signal representing behavioral anomaly when the change in a circuit current exceeds the predetermined level according to the embodiment of the invention, a switching transistor or a switching circuit which is rendered in a conductive or cut off state upon reception of the level of the detection signal may serve as the detection signal output part.

(b) It may be configured that after a detection voltage obtained at the detection terminals 40, 42 was rectified or a specific frequency component is taken out, it is converted into a digital signal, then the digital signal is fed to the processor 78 shown in FIG. 9, while the processor 78 is configured to serve as a detection signal output part, whereby it is determined whether or not behavioral anomaly occurs in the inverter 2, and output of the determination is fed to the latch input terminal 28 of the inverter control part 20 as a control input, so that the operation of the inverter 2 may be stopped. In this case, behavioral anomaly such as discharge, and so forth and the condition thereof may be displayed on the LCD 64 or indicator 76 when stopping the operation.

(c) Although the circuit wiring 16 and current detection line 36 shown in FIG. 2 are formed by a conductor pattern on a printed circuit board, they may be formed of wire rods other than the conductor pattern. When the wire rods are used, the circuit wiring 16 and the current detection line 36 are bundled to cause the magnetic flux change $\Delta\phi$ at the side of the circuit wiring 16 to act on the current detection line 36.

(d) The current change detection of the current change detection part 32 may be effected by a detector circuit for detecting and taking out components specific to discharge contained in the change in circuit current occurring due to disconnection discharge or dielectric breakdown discharge in other than a manner where the detection voltage of the detection terminals 40, 42 are rectified, smoothed out and taken out by the diode 44, capacitor 46 and resistor 48.

(e) If the inverter control part 20 dose not have an operation stopping part, as a control part which cancels the operation of the inverter 2, a switching circuit which cancels the supply of power relative to the inverter control part 20 by the detection voltage Vs at the time of behavioral anomaly may also be provided at the DC input side of the inverter control part 20.

(f) Although the inverter control part 20 is exemplified as the control part, the supply of power to the inverter control part 20 is controlled using the processor 78 as the control part and the inverter operation maybe stopped at the time of behavioral anomaly.

(g) Although exemplified is the inverter 2 as a prior art which is driven by a constant current or outputs a lower current in problem to be solved by the invention, the present invention is not limited to such an inverter.

(h) According to the embodiment of the invention, the primary winding 24 of the inverter transformer 22 is formed of a single winding for facilitating the explanation of the invention, a winding for taking out a feedback signal to be fed to each transistor of the push-pull inverter circuit incorporated in the inverter control part 20 is not excluded, and various inverters are included in the anomaly detection circuit of the inverter of the present invention.

(i) The anomaly detection circuit of the inverter has the current change detection part, and the current change detection part can comprise a rectifying part for rectifying a fluctuation voltage obtained by a magnetic flux change, and a smoothing part for smoothing a rectified voltage obtained by the rectifying part. According to a construction like this, it is possible to obtain a detection signal having a level which is in proportional to the circuit current change with high accuracy from a voltage generated in the current detection line, so that detection of the circuit current change caused by the very small discharge can be effected, thereby enhancing the accuracy of detection.

(j) In the anomaly detection circuit of the inverter, the current change detection part has a rectifying part for rectifying the fluctuation voltage obtained by the magnetic flux change, and the rectifying part can be formed of a Schottky diode. Since the Schottky diode has short reverse recovery time compared with a high speed diode, the circuit current change due to discharge and a noise component due to discharge are rectified to take out as a DC component so that the change in circuit current due to very small discharge can be detected, thereby enhancing the accuracy of detection to prevent an erroneous operation.

(k) In the anomaly detection circuit of the inverter, the current change detection part can be constructed to have the filter for extracting change in current due to disconnection discharge, dielectric breakdown discharge, and so forth. According to a construction like this, the change in circuit current due to discharge except a transient current change, for example, when power is tuned on, can be detected with accuracy, and an erroneous operation can be prevented.

(l) In the current detection circuit of the inverter, the current detection part can be constructed to have discrete elements comprising a part of the circuit wirings 14, 16, 52, 54, 70, 72 and the current detection line 36 which are independent from one another. According to a construction like this, the current change detection part is installed in the circuit wiring of the inverter 2, for example, in the circuit wirings 14, 16, 52, 54, 70, 72 at an arbitrary spot thereof, so that the inverter, and so forth can be protected from continuation of behavioral anomaly such as discharge and so forth, thereby enhancing reliability.

(m) In the current detection circuit of the inverter, the current detection part can be installed in an arbitrary spot of the circuit wiring leading from the DC input to the load on, the DC input side in the circuit wiring, a part on a primary winding and a part on a secondary winding of the inverter transformer 22 provided in the inverter, or on any of the combination of the parts on the DC input side, the primary and the secondary windings. According to a construction like this, behavioral anomaly such as discharge, and so forth can be detected in the circuit wirings 14, 16, 52, 54, 70, 72 at an arbitrary spot thereof.

(n) In the anomaly detection circuit of the inverter, the anomaly detection circuit can be constructed so that the display driving part is incorporated in the control part, and the output thereof is fed to the indicator, thereby displaying behavioral anomaly. According to a construction like this, the anomalous state can be easily grasped by displaying behavioral anomaly of the inverter and the stop of the inverter operation.

(o) In the anomaly detection circuit of the inverter, the inverter control part 20, the current change detection part 32 and the comparator 34 can be constructed by a single IC. According to a construction like this, a reliability of the anomaly detection circuit of the inverter can be enhanced by the IC, which is single in number and also commercial value of a control IC serving as a constituent of the inverter can be improved, and the number of part can be reduced at the same time.

(p) In the anomaly detection circuit of the inverter, the core 74 for forming a magnetic path which is common to the circuit wirings 14, 16, 52, 54, 70, 72 and the current detection line 36 may also be provided. That is, if a magnetic path which is common, for example, to the circuit wirings 16, 54, 72 and the current detection line 36 is formed using the core 74, the magnetic flux change $\Delta\phi$ at the side of the circuit wirings 16, 54, 72 can act efficiently on the current detection line 36 through the core 74. In this case, since the magnetic flux is intensified by magnetic permeability of the core 74 to act on the current detection line 36, the accuracy of detection of the circuit current change can be enhanced, thereby further enhancing a protecting function of the inverter 2 or the load at the time of behavioral anomaly. The magnetic flux change can be intensified by the magnetic permeability of a magnetic material of the core 74 which is a common magnetic path, and hence sensitivity in detection of the change in current can be enhanced.

(q) In the information processing device, the inverter can be used for the power supply device or the FL tube lighting device. According to a construction like this, a high reliable information processing device can be provided.

(r) A lighting device provided with the anomaly detection circuit of the inverter can be constructed. According to this construction, the detection of disconnection discharge and the dielectric breakdown discharge of the inverter, the stop of the operation, and the display accompanied thereby can be effected, thereby providing high reliable lighting device.

Figure 14:
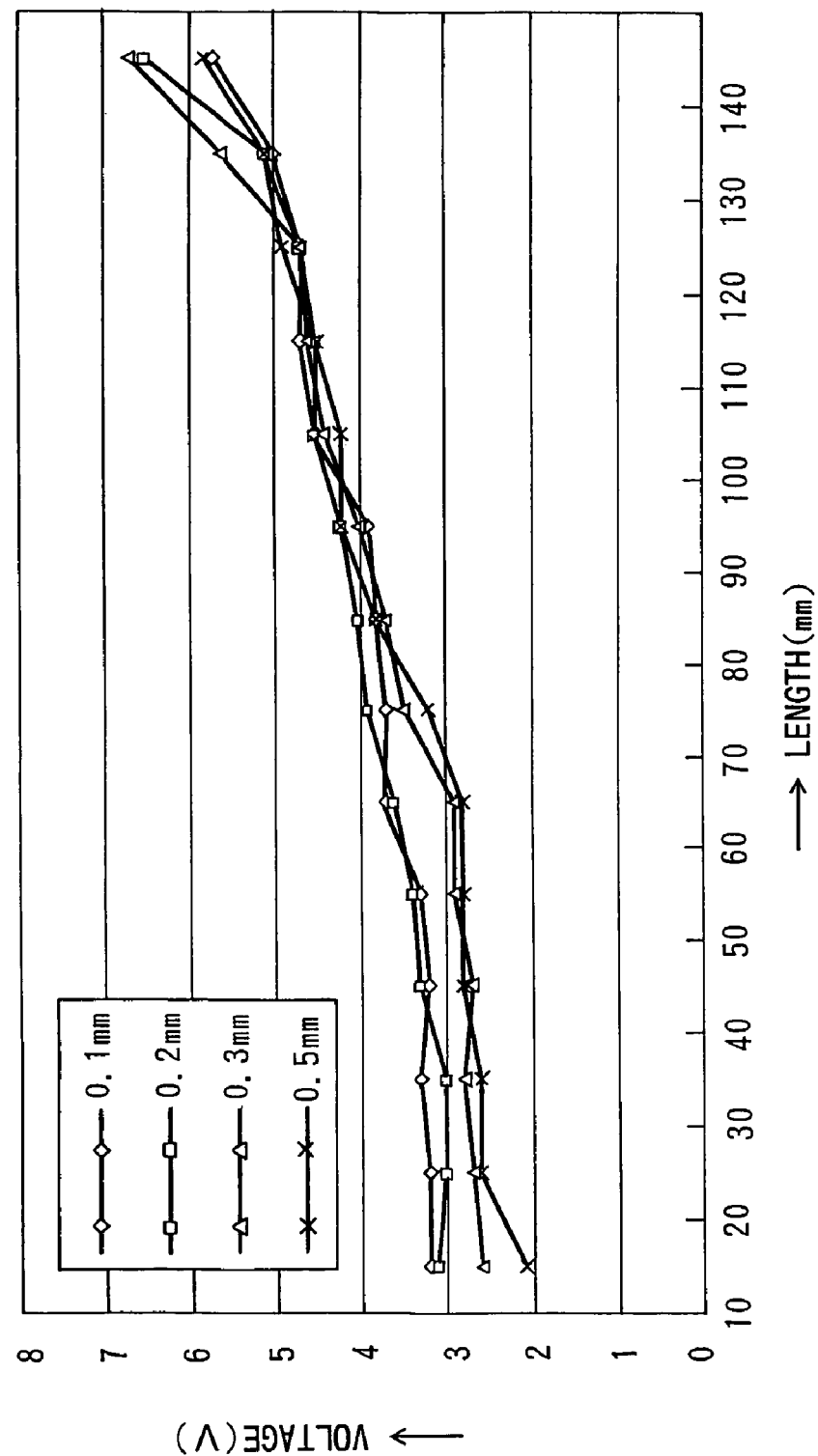
FIG. 14 is a drawing showing the result of an experiment of the current detection part according to the present invention.

Furthermore, the result of an experiment of the current detection part 30 is explained by referring to FIG. 14. In the case that, concerning the wiring pattern of the current detection line 36 (FIG. 2) namely the detection conductor, the length "b" of the current detection line 36 is made to change, and also the space "D" between the circuit wiring 16 and the current detection line 36 is set to D=0.1 mm, 0.2 mm, 0.3 mm and 0.5 mm, respectively, under the state that the width "a" of the current detection line 36 is set to a=10 mm, voltage shown in FIG. 14 is given to the current change detection part 32. As is clear from the result of the experiment, if the space "D" between the current detection line 36 and the circuit wiring 16 is set to D=0.5 mm under use of the current detection line 36 with the width a=10 mm and the length b=10 mm, it is confirmed that the detected voltage of 2V is obtained by a discharge current. According to this detected voltage, it is confirmed that the change in a circuit current due to discharge can be detected with high accuracy.

Although the best mode for carrying out the invention, the object, the configuration and the operation and effect have been described in detail above, the invention is not limited to such embodiment for carrying out the invention, and it is a matter of course that the invention can be variously changed or modified by a person skilled in the art on the basis of a gist and split of the invention as disclosed in claims and the detailed description of the invention, and such a change or modification, and various conjectured configurations, modified examples and so forth are included in the scope of the invention, and the description of the specification and drawings are not restrictively understood.

The entire disclosure of Japanese Patent Applications No. 2002-212666 and No. 2003-183034 including specifications, claims, drawings and summaries are incorporated herein by reference in their entirety.

What is claimed is:

1. A current detection method of an inverter that converts DC input into AC output and supplies the AC output to a load, comprising:
   allowing magnetic flux change occurring to a circuit wiring to act on a detecting conductor arranged in the vicinity of the circuit wiring, the magnetic flux change occurring because of a change in a circuit current due to discharge, both the detecting conductor and the circuit wiring being printed on a same side of a circuit board, the detecting conductor having a straight-line segment disposed parallel to a straight-line segment of the circuit wiring such that the magnetic flux change that occurs to the circuit wiring is allowed to act on the straight-line segment of the detecting conductor; and
   detecting the change in the circuit current through the medium of the magnetic flux change by the detecting conductor.

2. The current detection method of claim 1, further comprising:
   rectifying and smoothing a current detected by the detecting conductor by acting of the magnetic flux change occurring to the circuit wiring; and
   taking out a detection signal at a level representative of the change in the circuit current.

3. An anomaly detection method of an inverter that converts DC input into AC output and supplies the AC output to a load, comprising:
   allowing magnetic flux change occurring to a circuit wiring to act on a detecting conductor arranged in the vicinity of the circuit wiring, the magnetic flux change occurring because of a change in a circuit current due to discharge, both the detecting conductor and the circuit wiring being printed on a same side of a circuit board, the detecting conductor having a straight-line segment disposed parallel to a straight-line segment of the circuit wiring such that the magnetic flux change that occurs to the circuit wiring is allowed to act on the straight-line segment of the detecting conductor; and
   detecting the change in the circuit current through the medium of the magnetic flux change by the detecting conductor so as to detect based on a result of the detecting of the change in the circuit current whether or not anomaly exists in a current route including the load.

4. The anomaly detection method of claim 3, further comprising:
   rectifying and smoothing a current detected by the detecting conductor by acting of the magnetic flux change occurring to the circuit wiring; and
   taking out a detection signal at a level representative of the change in the circuit current.

5. A test method using an inverter that converts DC input into AC output and supplies the AC output to a load, comprising:
   allowing magnetic flux change occurring to a circuit wiring to act on a detecting conductor arranged in the vicinity of the circuit wiring, the magnetic flux change occurring because of a change in a circuit current due to discharge, both the detecting conductor and the circuit wiring being printed on a same side of a circuit board, the detecting conductor having a straight-line segment disposed parallel to a straight-line segment of the circuit wiring such that the magnetic flux change that occurs to the circuit wiring is allowed to act on the straight-line segment of the detecting conductor; and
   detecting the change in the circuit current through the medium of the magnetic flux change by the detecting conductor so as to decide based on a result of the detecting of the change in the circuit current whether or not anomaly exists in a current route including the load.

6. The test method of claim 5, further comprising:
   rectifying and smoothing a current detected by the detecting conductor by acting of the magnetic flux change occurring to the circuit wiring; and
   taking out a detection signal at a level representative of the change in the circuit current.

7. A current detection method, comprising:
   allowing a magnetic flux change produced by a circuit current flowing through a circuit wiring to act on a detecting conductor located in a vicinity of the circuit wiring, both the detecting conductor and the circuit wiring being printed on a same side of a circuit board, the detecting conductor having a straight-line segment disposed parallel to a straight-line segment of the circuit wiring such that the magnetic flux change that occurs to the circuit wiring is allowed to act on the straight-line segment of the detecting conductor; and
   detecting the change in the circuit current through the medium of the magnetic flux change on the detecting conductor.

8. The current detection method of claim 7, further comprising:
   rectifying and smoothing a current detected by the detecting conductor by acting of the magnetic flux change occurring to the circuit wiring; and
   taking out a detection signal at a level representative of the change in the circuit current.

* * * * *